United States Patent [19]
Kammerdiner et al.

[11] Patent Number: 5,969,935
[45] Date of Patent: Oct. 19, 1999

[54] USE OF CALCIUM AND STRONTIUM DOPANTS TO IMPROVE RETENTION PERFORMANCE IN A PZT FERROELECTRIC FILM

[75] Inventors: Lee Kammerdiner, Avondale; Tom Davenport; Domokos Hadnagy, both of Colorado Springs, all of Colo.

[73] Assignee: Ramtron International Corporation, Colorado Springs, Colo.

[21] Appl. No.: 08/616,856

[22] Filed: Mar. 15, 1996

[51] Int. Cl.$^6$ ........................................ H01G 4/06
[52] U.S. Cl. .................. 361/311; 361/321.4; 361/321.5; 257/295
[58] Field of Search .................. 361/311–313, 321.5, 361/321.4, 314, 315; 257/295, 296, 135, 151–153; 501/134–139; 252/62.9 PZ, 62.9 T; 365/145, 149; 264/614, 85, 234; 310/366, 358, 363, 365; 204/192.12, 192.15, 192.18, 192.2, 192.22

[56] References Cited

U.S. PATENT DOCUMENTS

| | | |
|---|---|---|
| 2,911,370 | 11/1959 | Kulcsar . |
| 3,179,594 | 4/1965 | Kulcsar et al. . |
| 4,124,671 | 11/1978 | Walker et al. . |
| 4,626,369 | 12/1986 | Walker, Jr. . |
| 5,104,690 | 4/1992 | Greenwald . |
| 5,112,433 | 5/1992 | Dawson et al. . |
| 5,281,888 | 1/1994 | Takeuchi et al. . |
| 5,337,279 | 8/1994 | Gregory et al. . |
| 5,338,999 | 8/1994 | Ramakrishna et al. ................... 310/58 |
| 5,376,857 | 12/1994 | Takeuchi et al. . |
| 5,378,382 | 1/1995 | Nichimura et al. . |

FOREIGN PATENT DOCUMENTS

| | | |
|---|---|---|
| 600303 | 6/1994 | European Pat. Off. . |
| 2-94507 | 4/1990 | Japan . |

OTHER PUBLICATIONS

M. Huffman, et al., "Morphology and Electrical Characterization of Calcium Modified Ferroelectric Lead Zirconate Titanate Films", *Ferroelectrics*, vol. 143, pp. 252–262, ©1993.

Kulcsar, F., "Electromechanical Properties of Lead Titanate Zirconate Ceramics with Lead Partially Replaced by Calcium or Strontium," Journal of the American Ceramic Society, Jan. 1959, pp. 49–51, Westerville, Ohio.

Jaffe, B., et al., "Piezoelectric Ceramics," 1971, Academic Press, New York, New York.

Atkin, R.B., "Performance of Sputtered $Pb_{0.92}$ $Bi_{0.07}$ $La_{0.01}(Fe_{0.0405}Nb_{0.325}Zr_{0.27})O_3$ Ferroelectric Memory Films," Ferroelectrics 1972, vol. 3, pp. 213–215, Norwich, England.

Sharma, B.S., et al., "Retention in Thin Ferroelectric Films," Ferroelectrics 1973, vol. 5, pp. 69–75, Norwich, England.

Mehta, R.R., et al., "Depolarization Fields in Thin Ferroelectric Films," Journal of Applied Physics, vol. 44, No. 8, Aug. 1973, pp. 3379–3385, Woodbury, New York Yamaka, E., et al., "Structural, Ferroelectric, and Pyroelectric Properties of Highly C–Axis Oriented $Pb_{1-x}Ca_xTiO_3$ Thin Film Grown by Radio–Frequency Magnetron Sputtering," Journal of Vacuum Science Technology, Sep./Oct. 1988, pp. 2921–2928, College Park, Maryland.

(List continued on next page.)

*Primary Examiner*—Kristine Kincaid
*Assistant Examiner*—Anthony Dinkins
*Attorney, Agent, or Firm*—Peter J. Meza

[57] ABSTRACT

A lead zirconate titanate ferroelectric film used as the dielectric layer in a ferroelectric capacitor is doped with calcium and/or strontium, and the lead composition selected to improve data retention performance. The chemical formula for the ferroelectric film is: $(Pb_vCa_wSr_xLa_y)(Zr_zTi_{(1-z)})O_3$; wherein v is ideally between 0.9 and 1.3; w is ideally between 0 and 0.1; x is ideally between 0 and 0.1; y is ideally between 0 and 0.1, and z is ideally between 0 and 0.9. In addition, the chemical composition of the ferroelectric film is further specified in that the measured opposite state charge at a specific time and temperature of the ferroelectric capacitor is greater than eight micro-Coulombs per square centimeter, and the rate of imprint degradation is less than fifteen percent per decade.

9 Claims, 23 Drawing Sheets

OTHER PUBLICATIONS

Shepherd, W.H., "Fatigue and Aging in Sol–Gel Derived PZT Thin Films," Materials Research Society Symposium Proceedings vol. 200, 1990, pp. 277–289, Pittsburgh, Pennsylvania.

Abt, N., "Electrical Measurement of Ferroelectric Capacitors for Non–Volatile Memory Applications," Materials Research Society Symposium Proceedings vol. 200, 1990, pp. 303–312, Pittsburgh, Pennsylvania.

Kulkarni, J., et al., "Ageing of Volatile and Non–Volatile Components of the Remnant Polarization in PZT," Proceedings of the International Symposium on Integrated Ferroelectrics (1992), pp. 363–369, National Semiconductor Corp., Santa Clara, California.

Huffman, M., et al., "Morphology and Electrical Characterization of Calcium Modified Ferroelectric Lead Zirconate Titanate Films," Ferroelectrics, 1993, v. 143, n. 1/4, pp. 251–262, Norwich, England.

Dat, R., et al., "Imprint Testing of Ferroelectric Capacitors Used for Non–Volatile Memories," Integrated Ferroelectrics, 1994, vol. 5, pp. 275–286, Amsterdam B.V.

Evans, J.T. Jr., et al., "The Imprint Mechanism in Ferroelectric Capacitors," Proceedings of the International Symposium on Integrated Ferroelectrics (1995), Radiant Technologies, Inc., Albuquerque, New Mexico.

Lee, J., et al., "Imprint of $(Pb,La)(Zr,Ti)O_3$ Thin Films With Various Crystalline Qualities," Applied Physics Letter, vol. 68, No. 4, Jan. 22, 1996, Woodbury, New York.

USE OF CALCIUM AND STRONTIUM DOPANTS TO IMPROVE RETENTION PERFORMANCE IN A PZT FERROELECTRIC FILM

BACKGROUND OF THE INVENTION

This application contains subject matter which is related to copending U.S. patent application Ser. No. 08/616,913 entitled A METHOD OF MEASURING RETENTION PERFORMANCE AND IMPRINT DEGRADATION OF FERROELECTRIC FILMS filed on the same date as this application entitled "A Method of Measuring Retention Performance and Imprint Degradation of Ferroelectric Films", which is incorporated herein by this reference.

This invention relates generally to ferroelectric films. More particularly, the present invention relates to doping lead zirconate titantate ("PZT") ferroelectric films with either strontium or calcium, or a combination thereof, and by controlling the lead composition of the PZT film, in a manner that improves data retention performance in a ferroelectric capacitor, and in a corresponding ferroelectric memory.

Within film grain boundaries, PZT crystallizes in the perovskite structure shown in FIG. 1. Unit cell 10 is a simple cubic unit with a large cation 12 on the corners of the unit cell, a smaller cation 16 in the body center of the unit cell, and oxygen anions 14 in the centers of the unit cell faces. Each large cation 12 occupies a designated "A site" in unit cell 10, which, in PZT, is lead (Pb). The small cation 16 occupies the designated "B site" in unit cell 10, which, in PZT, is either zirconium (Zr) or titanium (Ti). Each oxygen anion 14 occupies a designated "O site" in unit cell 10. The perovskite structure is a network of corner-linked oxygen octahedra, with the smaller cation 16 filling the octahedral holes and the large cation 12 filling the dodecahedral holes.

The unit cell 10 shown in FIG. 1 is not a perfect cube, but is slightly distorted, with the small cation 16 occupying one of two stable positions within the unit cell. Since the small cation 16 is not exactly in the center of the unit cell 10, the perovskite crystal has an associated spontaneous electric dipole. PZT is ferroelectric in that the direction of the electric dipole can be reversed by the temporary application of an external electric field. The direction of the electric dipole remains until an opposite electric field is applied.

Referring now to FIGS. 2A and 2B, a ferroelectric capacitor 18 is shown, wherein the dielectric material of the capacitor is formed of PZT or other ferroelectric materials. A corresponding hysteresis loop 20 is shown that is a measure of the ferroelectric polarization of ferroelectric capacitor 18. The applied external electric field is represented along the x-axis, and the resultant charge or polarization is represented along the y-axis. Once an externally applied electric field exceeds a material-specific "coercive voltage" ($V_C$), ferroelectric capacitor 18 begins to polarize. If the applied electric field is increased, the ferroelectric material in capacitor 18 becomes fully polarized or "saturated", wherein the polarization vector of most of the grains in the material are aligned in the same direction. Once the external electric field is removed, a remanent polarization represented by point $Q_2$ remains. If the electric field is reversed in polarity and exceeds the coercive voltage ($-V_C$) in the opposite direction, ferroelectric capacitor 18 begins to polarize in the opposite direction. If the applied electric field is increased, the ferroelectric material in capacitor 18 saturates in the opposite direction. Once the external electric field is removed, a remanent polarization represented by point $Q_1$ remains. The remanent polarization of "stable states" $Q_1$ and $Q_2$ of ferroelectric capacitor 18 can be toggled by application of two opposite external voltages exceeding the coercive voltage.

Referring now to FIG. 3, an integrated ferroelectric memory cell 22 includes two ferroelectric capacitors 48A and 48B, as well as two field-effect transistors ("FETs") 46A and 46B. More specifically, ferroelectric memory cell 22 is actually the combination of two one-transistor, one-capacitor ("1T-1C") memory cells sharing a common bit line contact. Memory cell 22 includes a substrate or epitaxial layer 24, a thick field oxide layer 26 for isolating transistors associated with one pair of memory cells from the next, diffused areas 28 for forming the drain and source regions of transistors 46A and 46B, gate electrodes 30 that are each coupled to or form portions of a word line (extending orthogonal to the plane of FIG. 3 and therefore not shown), and isolation layers 32 and 34. Capacitors 48A and 48B are formed with a bottom electrode 36, typically fabricated of platinum and connected to a common "plate line" that is in turn coupled to a plurality of memory cells. The plate line is also orthogonal to the plane of FIG. 3 and therefore not shown. Capacitors 48A and 48B also include a ferroelectric dielectric layer 38 and a top electrode 40, also usually fabricated of platinum. The top electrodes 40 of the capacitors are coupled to respective source regions of transistors 46A and 46B via a metalization layer 42. Metalization layer 42 also contacts the common drain of transistors 46A and 46B, forming a common bit line contact. A passivation layer 44 of silicon dioxide ($SiO_2$) is subsequently deposited over the entire surface of the integrated circuit.

The schematic diagram of FIG. 4A shows a memory cell 22' that roughly corresponds to the integrated ferroelectric memory cell 22 shown in the cross sectional diagram of FIG. 3, except that two distinct bit lines are shown instead of a single shared bit line contact. Memory cell 22' includes a word line 50 designated "WL", a plate line 52 designated "PL" and separate bit lines 54 and 56 designated BL and BL*, respectively. One portion of the memory cell 22' includes transistor 46A and ferroelectric capacitor 48A. Word line 50 is coupled to transistor 46A through gate contact 30, plate line 52 is coupled to ferroelectric capacitor 48A through bottom electrode 36, and bit line 54 is coupled to transistor 46A through one of the diffused areas 28. The other portion of memory cell 22' includes transistor 46B and ferroelectric capacitor 48B. Word line 50 is coupled to transistor 46B through gate contact 30, plate line 52 is coupled to ferroelectric capacitor 48B through bottom electrode 36, and bit line 54 is coupled to transistor 46B through one of the diffused areas 28.

Typically, in a two-transistor, two-capacitor ("2T-2C") memory cell having complementary bit lines, a valid logic state is resolved by comparing the two bit lines with a sense amplifier (not shown in FIG. 4A). Capacitors 48A and 48B are poled in opposite directions. When interrogated by pulsing the plate line 52, differing amounts of charge are transferred to the bit lines, depending upon the direction of the polarization vector in capacitors 48A and 48B.

The schematic diagram of FIG. 4B shows a 1T-1C ferroelectric memory cell 58. Memory cell 58 includes a word line 50, a plate line 52, a bit line 54 and a reference line 60 designated "REF." Word line 50 is coupled to the gate of transistor 46, plate line 52 is coupled to ferroelectric capacitor 48, and bit line 54 is coupled to a drain/source node of transistor 46. Typically, in a 1T-1C memory cell a valid logic state is resolved on bit line 54 by comparing the bit line charge and the reference charge on reference line 60 with a sense amplifier (not shown in FIG. 4B). When interrogated by pulsing the plate line 52, a charge is transferred to bit line 54 that is either less than or greater than the reference charge, so that a valid logic state can be resolved by the sense amplifier.

The operation of ferroelectric capacitors such as those found in the memory cells of FIG. 4A and FIG. 4B is described in further detail with reference to the hysteresis FIG. 160 shown in FIG. 6A and the corresponding voltage waveform shown in FIG. 6B. FIG. 6A is a plot of the voltage versus charge or polarization behavior of a ferroelectric capacitor. While reference may be made to "charge" in the dielectric of the ferroelectric capacitor, it should be noted that the capacitor charge dissipates, i.e. is volatile. However hysteresis curve 160 also represents polarization, which is non-volatile. Reference is made to both aspects of charge and polarization, which generally correspond before the charge on the ferroelectric capacitor dissipates. One characteristic of a ferroelectric material such as PZT is a hysteresis curve or loop 160 as shown in FIG. 6B, wherein the x-axis represents the field voltage applied to the material and the y-axis represents the polarization vector (or charge) of the ferroelectric material. The flow of current through a ferroelectric capacitor depends on the prior history of the applied voltages. A voltage waveform 168 is shown in FIG. 6B that includes two positive voltage pulses and two negative voltage pulses that are applied to one electrode of a ferroelectric capacitor in a Sawyer tower circuit arrangement, which is explained in further detail below with reference to FIG. 5. The exact timing of the pulses is arbitrary, and can include extremely long pulse widths. Circled point numbers one through six on hysteresis curve 160 of FIG. 6A correspond to the same circled point numbers on the voltage waveform 168 of FIG. 6B.

Turning momentarily to FIG. 5, a Sawyer tower circuit is shown having a ferroelectric capacitor 152 in series with a conventional, "linear" load capacitor 154. The size of load capacitor 154 is made large with respect to the size of ferroelectric capacitor 152 so that most of the input voltage, $V_{IN}$, supplied by voltage waveform 150, is dropped across ferroelectric capacitor 152. The output voltage, $V_{OUT}$, provided by the Sawyer tower circuit, generates the characteristic hysteresis curve 156 typical of ferroelectric materials such as PZT.

Referring again to FIG. 6A, starting at a first point 161 on both the hysteresis FIG. 160 and the voltage waveform of FIG. 6B (which also corresponds to circled point number one), there is no externally-applied voltage across the ferroelectric capacitor being characterized, but previously a voltage was applied across the ferroelectric capacitor that left the capacitor polarized at point 161. Applying a positive voltage across the ferroelectric capacitor moves the operating point (i.e., the current polarization) along the hysteresis curve 160 to a second point 162. The change in polarization vector or charge is designated "P" and is labeled on the rising edge of the first voltage pulse shown in the voltage waveform 168 of FIG. 6B and on the hysteresis curve 160 shown in FIG. 6A. The charge liberated with the change in polarization vector (in this case, traversing from point 161 to point 162) is referred to as the "switched charge." Next, the trailing edge of the first pulse in FIG. 6B occurs between circled numbers 2 and 3, or points 162 and 163 on hysteresis curve 160. This transition is typically caused by a return-to-zero transition in the externally applied voltage. Returning the externally-applied positive voltage pulse moves the polarization along the hysteresis curve 160 to a third point 163. The direction component of spontaneous remnant polarization within the ferroelectric capacitor is unchanged in the transition from point 162 to point 163, although there is some loss of field induced polarization, i.e. a loss in the polarization magnitude in a non-ideal ferroelectric material used in the capacitor dielectric. The change in charge is designated "$P_a$" (which is read as "P after") and is labeled on the falling edge of the first voltage pulse shown in FIG. 6B and on the hysteresis curve 160 shown in FIG. 6A. Circled point 3 on waveform 168 represents a zero externally-applied voltage and, but note that while the horizontal (voltage) component of hysteresis curve 160 is zero at point 163, there is a non-zero vertical component. Ideally, this remnant polarization ought to remain indefinitely. However, in practice some "relaxation" may occur. This is shown in FIG. 6A as the transition between points 163 and 164. Specifically, between the third and fourth points 163 and 164 on the hysteresis curve 160, there is a reversal of the polarization vector in some portion of the domains within the ferroelectric capacitor, resulting in a partial loss of the overall polarization magnitude.

Applying a second positive voltage across the ferroelectric capacitor moves the operating point from the fourth point 164 on the curve 160 back to the second point 162. The increase in charge is now labeled "U" and is less than the P increase produced by the first positive voltage. Removing the applied positive voltage moves the operating point to the fifth point 165 on the hysteresis curve 160, with a corresponding loss of charge labeled "$U_a$" (which is read as "U after").

Applying a negative voltage across the ferroelectric capacitor at the fifth point 165 on the hysteresis curve 160 moves the operating point to a sixth point 166. The change in charge and polarization is labeled "N" and is shown on the leading edge of the first negative pulse in FIG. 6B (circled point 6 of waveform 168). The negative voltage reverses the polarization direction of the capacitor, resulting in the original polarization direction. Since the hysteresis curve is substantially symmetrical, removing and reapplying the negative voltage moves the operating point around the "bottom" portion of the hysteresis curve 160 in the same manner as described above with reference to operating points 161 through 165. The associated changes in charge around the bottom of hysteresis loop 160 are consecutively labeled "N", "$N_a$" (which is read as "N after), "D" and "$D_a$" (which is read as "D after") on waveform 168 of FIG. 6B. Note that the relaxation of the loop is not shown in the bottom portion of hysteresis loop 160, though it exists in a non-ideal ferroelectric capacitor. For the sake of simplicity in FIG. 6A, the bottom charge components labeled "$N_a$", "D" and "$D_a$" are assumed to all be approximately equal. After the two negative voltage pulses are applied and returned to zero applied volts, the operating point is returned to the first point 161 on the hysteresis curve 160.

The memory cells shown in FIGS. 4A and 4B have the ability to store non-volatile data since the polarization vector stored in the ferroelectric capacitors in the cells remains once the poling electric field has been removed. The ability to preserve data in a ferroelectric memory for a long period of time is generally known as "retention." Retention includes the ability to store and read the same data state (same state performance). Retention also includes the ability to store an initial data state for a long period of time, followed by writing an opposite data state and correctly reading that opposite data state (opposite state performance). While the same state performance of a ferroelectric memory is seldom at issue, the opposite state performance of a ferroelectric memory is frequently a cause for concern. The failure to correctly read the opposite data state is generally known as "imprint", and refers to the fact that the original data state has been imprinted in the memory.

It is desirable, therefore, that retention performance be maximized as much as possible, primarily by minimizing the imprint failure mechanism. It is known that either strontium (Sr) or calcium (Ca) used singly can be used to dope the A site of the unit cell 10 for various purposes such as influencing the dielectric properties of a ferroelectric material. It is also known that lanthanum (La) can be used to dope the A site of the unit cell 10 for improved endurance (ability to withstand loss of polarization due to cycling) of a ferroelectric memory. However, any improvement in retention performance attained by the prior art single species dopant method must be further improved to meet the ever increasing demands of the marketplace for quality non-volatile memory devices.

What is desired is a ferroelectric memory having maximum retention performance beyond that which is currently available.

SUMMARY OF THE INVENTION

It is, therefore, a principal object of the present invention to maximize the retention performance of ferroelectric capacitors and non-volatile ferroelectric memories.

It is an advantage that doping PZT with strontium and/or calcium in the manner specified by the invention make ferroelectric capacitors and non-volatile ferroelectric memories less sensitive to process integration line degradation.

According to the present invention, a lead zirconate titanate ferroelectric film used as the dielectric layer in a ferroelectric capacitor is doped with calcium and/or strontium, and the lead composition selected to improve data retention performance. The calcium and strontium partially replace lead in the "A" sites of the perovskite crystal lattice. The resultant film composition increases the ability of the film to retain a polarization state over time. The ferroelectric film can also be doped with lanthanum, which aids in increasing endurance performance. The chemical formula for the ferroelectric film is: $(Pb_v Ca_w Sr_x La_y)(Zr_z Ti_{(1-z)})O_3$; wherein v is ideally between 0.9 and 1.3; w is ideally between 0 and 0.1; x is ideally between 0 and 0.1; y is ideally between 0 and 0.1, and z is ideally between 0 and 0.9. In addition, the chemical composition of the ferroelectric film is further specified in that the measured opposite state charge at a predetermined time and temperature of the ferroelectric capacitor is greater than eight micro-Coulombs per square centimeter, and the rate of imprint degradation is less than fifteen percent per decade.

The method for making the ferroelectric film as the dielectric layer in a ferroelectric capacitor includes sputtering onto a bottom electrode from a target comprising lead zirconate titanate doped with the combination of or subcombinations of calcium, strontium, and lanthanum to a film thickness between 750 Angstroms and 5000 Angstroms. A top electrode is subsequently formed, wherein the top and bottom electrodes are typically noble metals such as platinum. The resultant ferroelectric capacitor is coupled to an integrated MOS transistor to form a ferroelectric memory cell with improved retention performance.

The foregoing and other objects, features and advantages of the invention will become more readily apparent from the following detailed description of a preferred embodiment of the invention which proceeds with reference to the accompanying drawings.

DETAILED DESCRIPTION

Measuring Opposite State Charge

Figure 1:
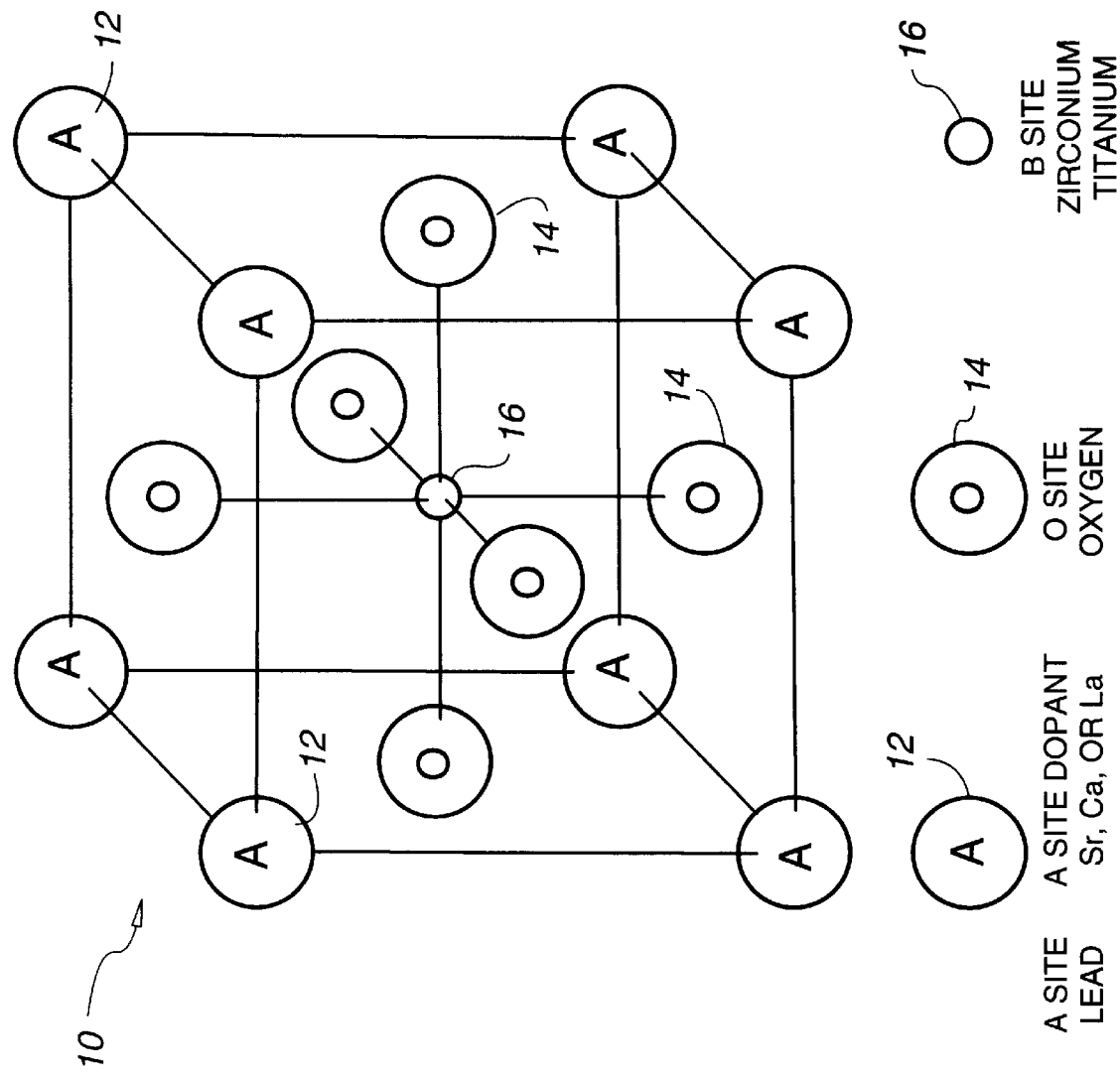
FIG. 1 is a diagram of the perovskite crystal structure for a unit cell that is associated with PZT and other ferroelectric materials, showing the A site dopants strontium, calcium, or lanthanum.
Figure 2A:
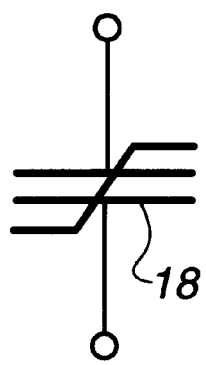
FIGS. 2A and 2B are a schematic diagram of a ferroelectric capacitor and an associated hysteresis loop describing the relationship between a voltage applied to the ferroelectric capacitor and the resulting polarization.
Figure 2B:
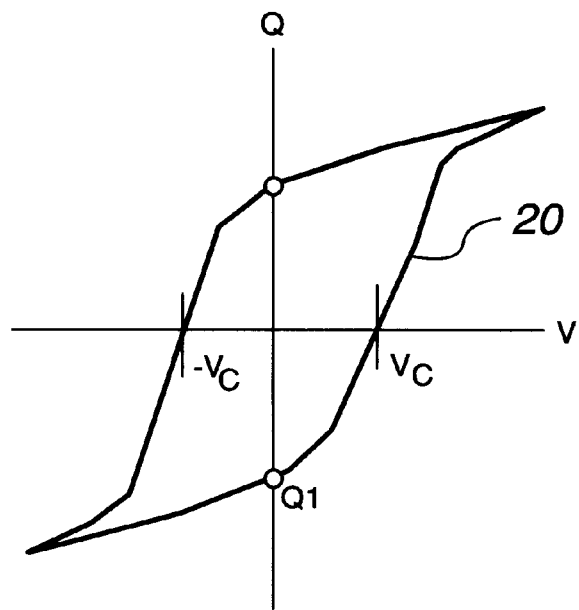
Figure 3:
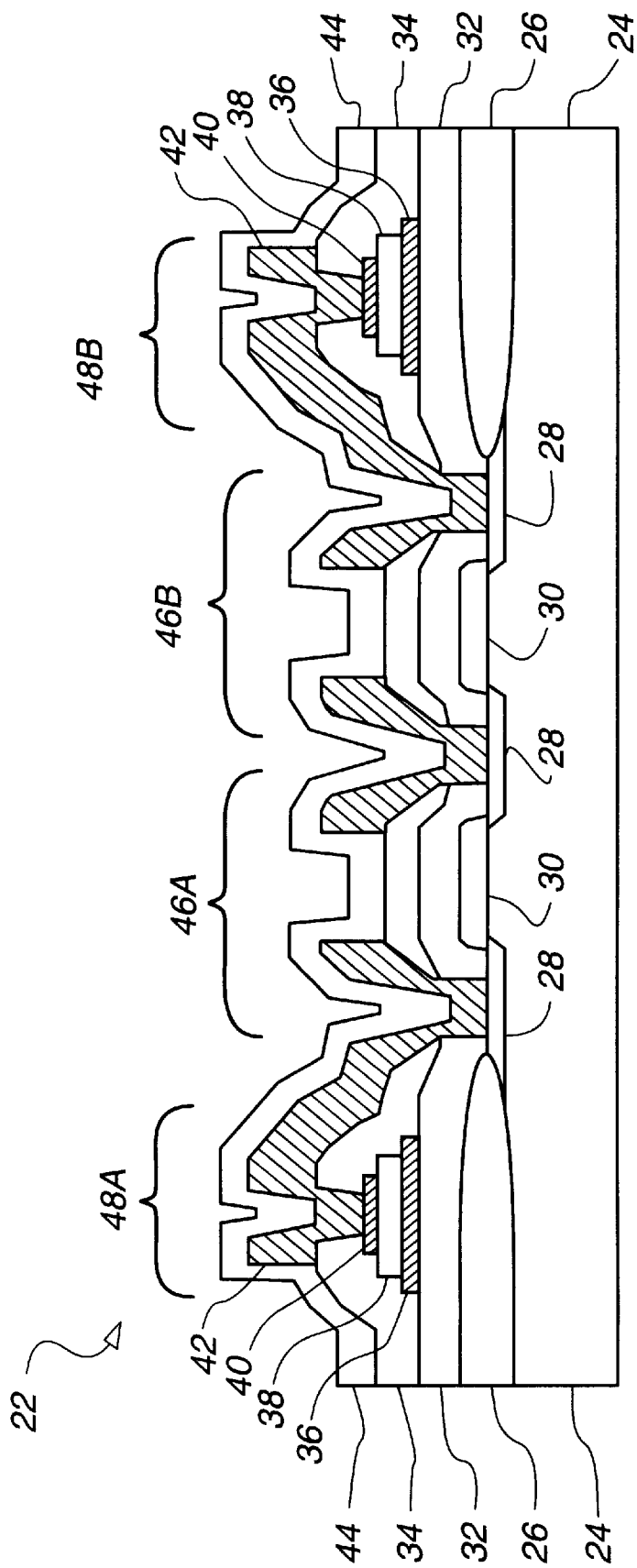
FIG. 3 is a cross-sectional diagram of an integrated ferroelectric memory cell.
Figure 4B:
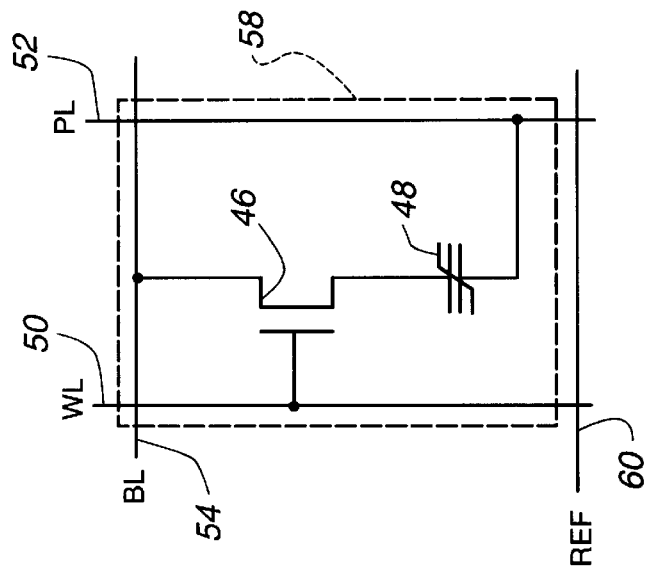
FIG. 4B is a schematic diagram of a 1T-1C ferroelectric memory cell roughly corresponding to one half of the cross-sectional diagram of FIG. 3.
Figure 4A:
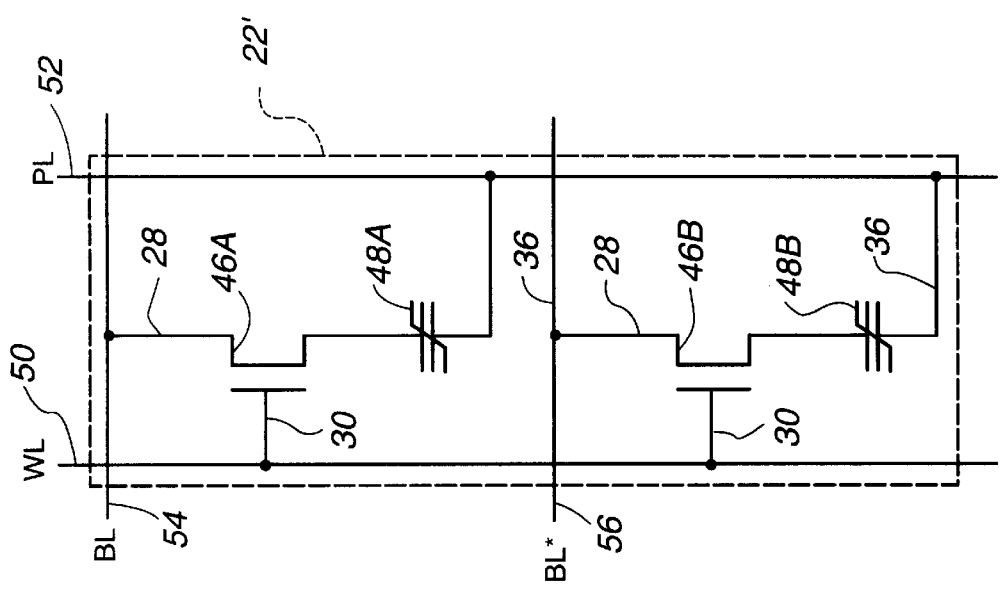
FIG. 4A is a schematic diagram of a 2T-2C ferroelectric memory cell roughly corresponding to the cross-sectional diagram of FIG. 3.
Figure 7:
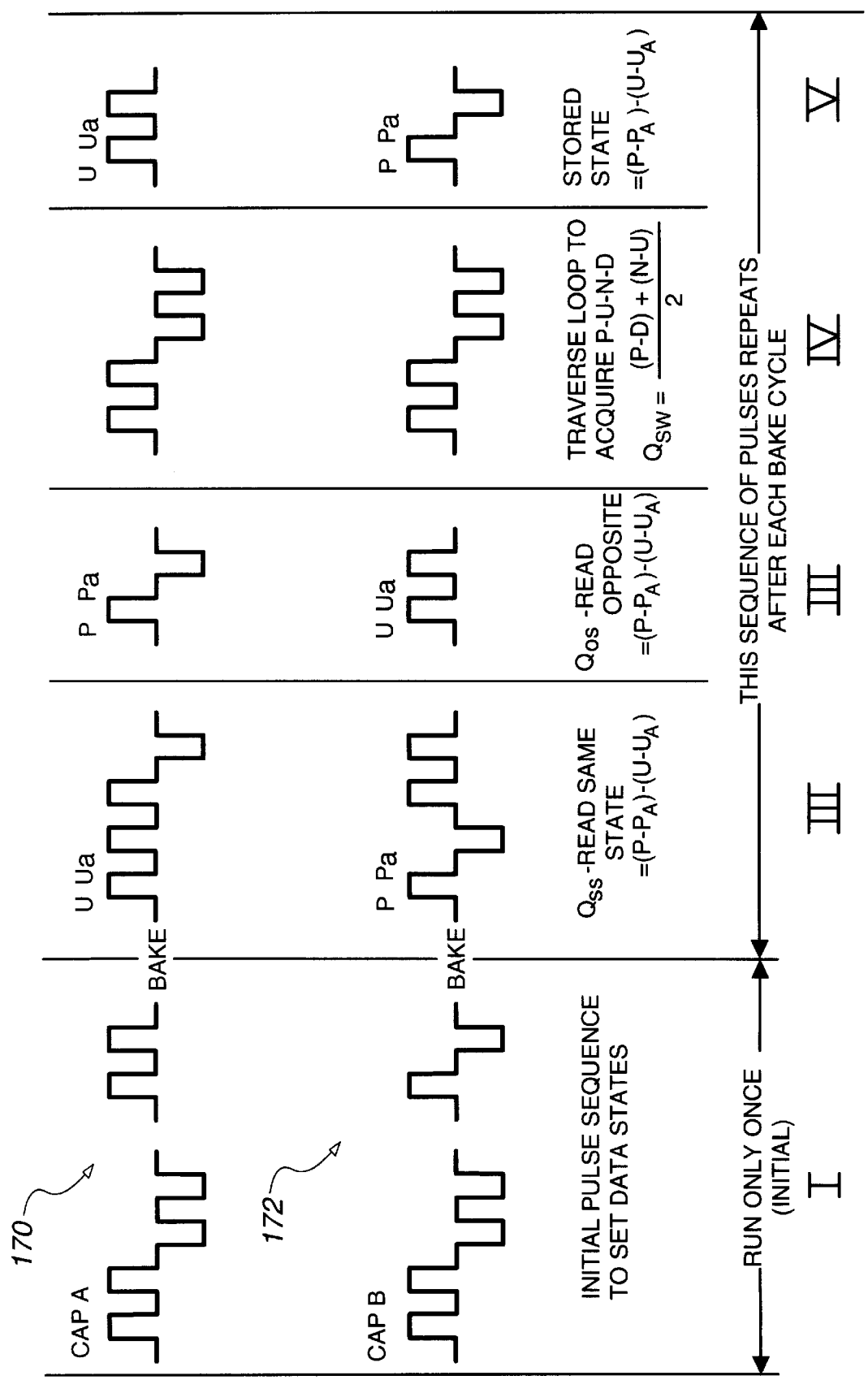
FIG. 7 is a timing diagram of a pair of input pulse waveforms for conducting an opposite state charge test on a pair of ferroelectric capacitors.

A pulse sequence for a more sophisticated test for accurately measuring the retention performance of a pair of ferroelectric capacitors is shown in FIG. 7. Retention performance is determined from a measurement of capacitor charge over time and temperature, when the capacitors are poled according to the pulse sequences shown in FIG. 7. The testing technique closely emulates the actual pulse sequence of the 2T/2C memory cell shown in FIG. 4A.

The measurement of charge is carried out on two ferroelectric capacitors "CAP A" and "CAP B" (capacitors are not shown in FIG. 7) according to corresponding two pulse sequences 170 and 172. In a first portion (I) of the pulse sequences, the two capacitors are initialized to opposite polarity data states. The capacitors are subsequently baked for one hour at 150° C., which imprints the initial or "same state." In a second portion (II) of the pulse sequences, the data states of the capacitors are read, and the opposite data state is written into the capacitors. In a third portion (III) of the pulse sequences, the opposite data states are read. The resultant charge is referred to as the "opposite state charge" or simply "$Q_{OS}$". The opposite state charge is used to predict retention loss due to imprint in ferroelectric capacitors and ferroelectric memories. In a fourth portion (IV) of the pulse sequences, the hysteresis loop is again traversed, and in a fifth portion (V) of the pulse sequence, the original data states are again set in the capacitors. The second through fifth portions of the pulse sequences are repeated after each subsequent bake cycle.

Figure 8:
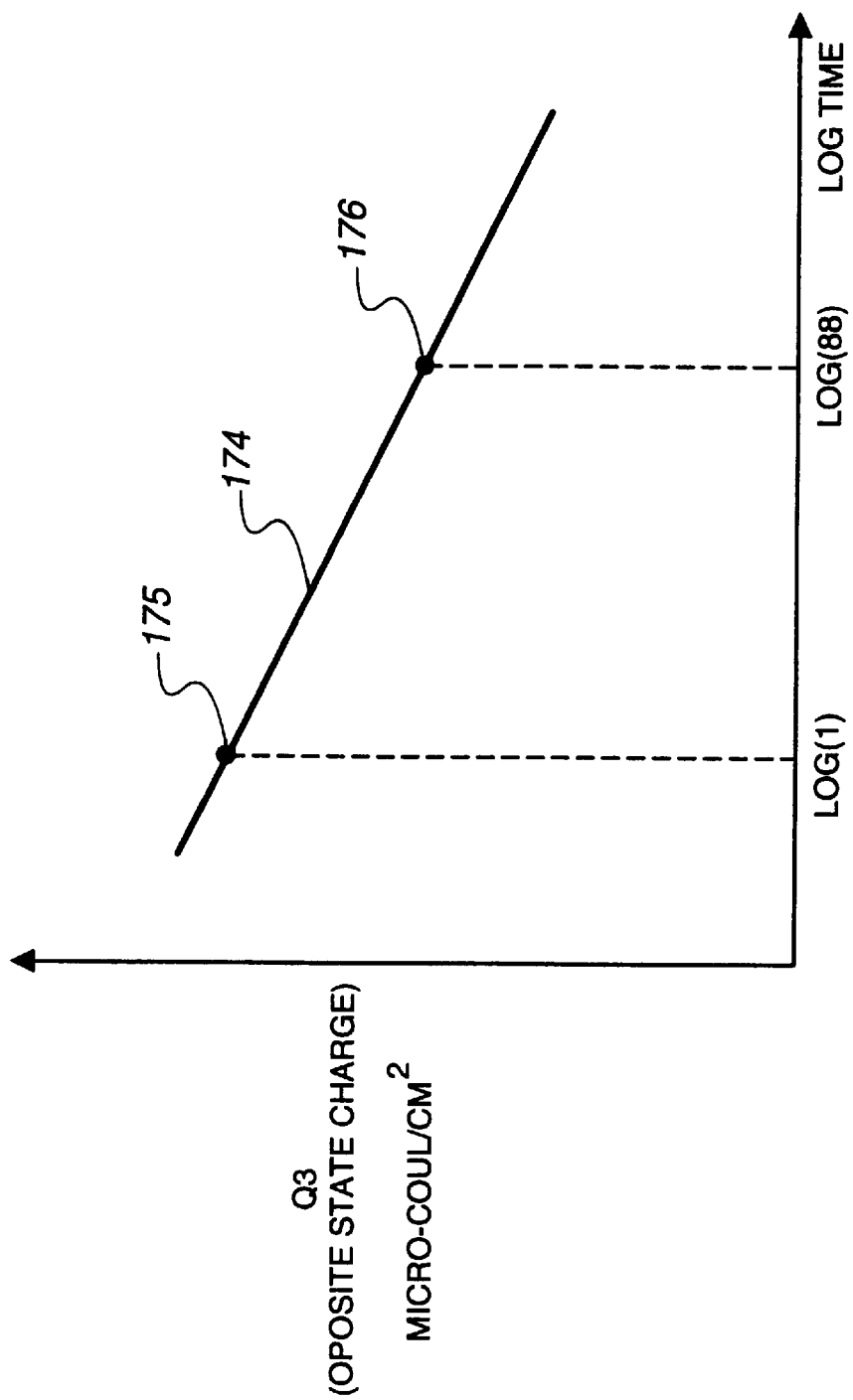
FIG. 8 is a plot of imprint degradation versus time for a typical ferroelectric capacitor.

The data acquired after each baking cycle is stored and is used to generate the graph shown in FIG. 8. In particular, the graph of FIG. 8 shows the opposite state charge recorded as function of the logarithm of time. When the opposite state charge is plotted against log time, a straight line can be drawn through the plotted data. The charge 176 at 88 hours, for example, or its extrapolated equivalent, and the slope 174 divided by the charge 175 at one hour are used to set the criteria for ferroelectric materials and capacitors that exhibit increased retention performance. The slope 174 of the graph in FIG. 8 can also be referred to as the rate of "imprint degradation". It has been determined through numerous experiments and observations that for acceptable reliability performance, ferroelectric capacitors should ideally exhibit an opposite state charge of greater than eight micro-Coulombs at 88 hours at 150° C. and a rate of imprint degradation in time of less than fifteen percent per natural decade of time. The opposite state charge 176 at 88 hours, and the rate of imprint degradation 174 are used to set the contours for ferroelectric films having increased retention performance in FIGS. 9–17. The ferroelectric films in FIGS. 9–17 have increased retention performance since the imprint mechanism is minimized by a careful selection of the ferroelectric constituent elements, as is described in greater detail below.

The opposite state charge test described above is described in further detail as part of a comprehensive retention test in the copending patent application assigned to the present assignee entitled "A Method of Measuring Retention Performance and Imprint Degradation of Ferroelectric Films", Ser. No. 08/616,913, filed Mar. 15, 1996.

Composition Contours for Increased Retention Performance due to Minimized Imprint Referring now generally to FIGS. 9–17, each figure is a contour plot that varies the composition of strontium from zero to ten percent, and of calcium from zero to ten percent. The composition of lead is fixed in each plot, but varies by five percent in each subsequent contour plot from 90 to 130 percent. The amount of lanthanum doping is set at 1.5 percent, but lanthanum doping does not materially effect the retention performance of the film. Lanthanum is primarily added for increasing the endurance of the film. The amount of titanium is set at sixty percent and the zirconium is set at forty percent. Again, the ratio of titanium to zirconium is not deemed to materially affect the retention performance. The dashed line contours in FIGS. 9–17 represent the amount of opposite state charge ("$Q_{OS}$") that has been measured at the actual or extrapolated 88 hour cumulative bake time. The solid line contours in FIGS. 9–17 represent the rate of imprint degradation. The heavy solid line numbered contour bounds a material having increased retention performance, according to opposite state charge and imprint degradation criterion set forth above. While the numbered contours in FIGS. 9–17 set forth the bounds of the improved retention performance ferroelectric material, it should be taken into account that the contours are generated using computer models based upon dozens of successful candidates materials. Therefore, some small amount of error will exist in the exact placement of the numbered contours.

Figure 9:
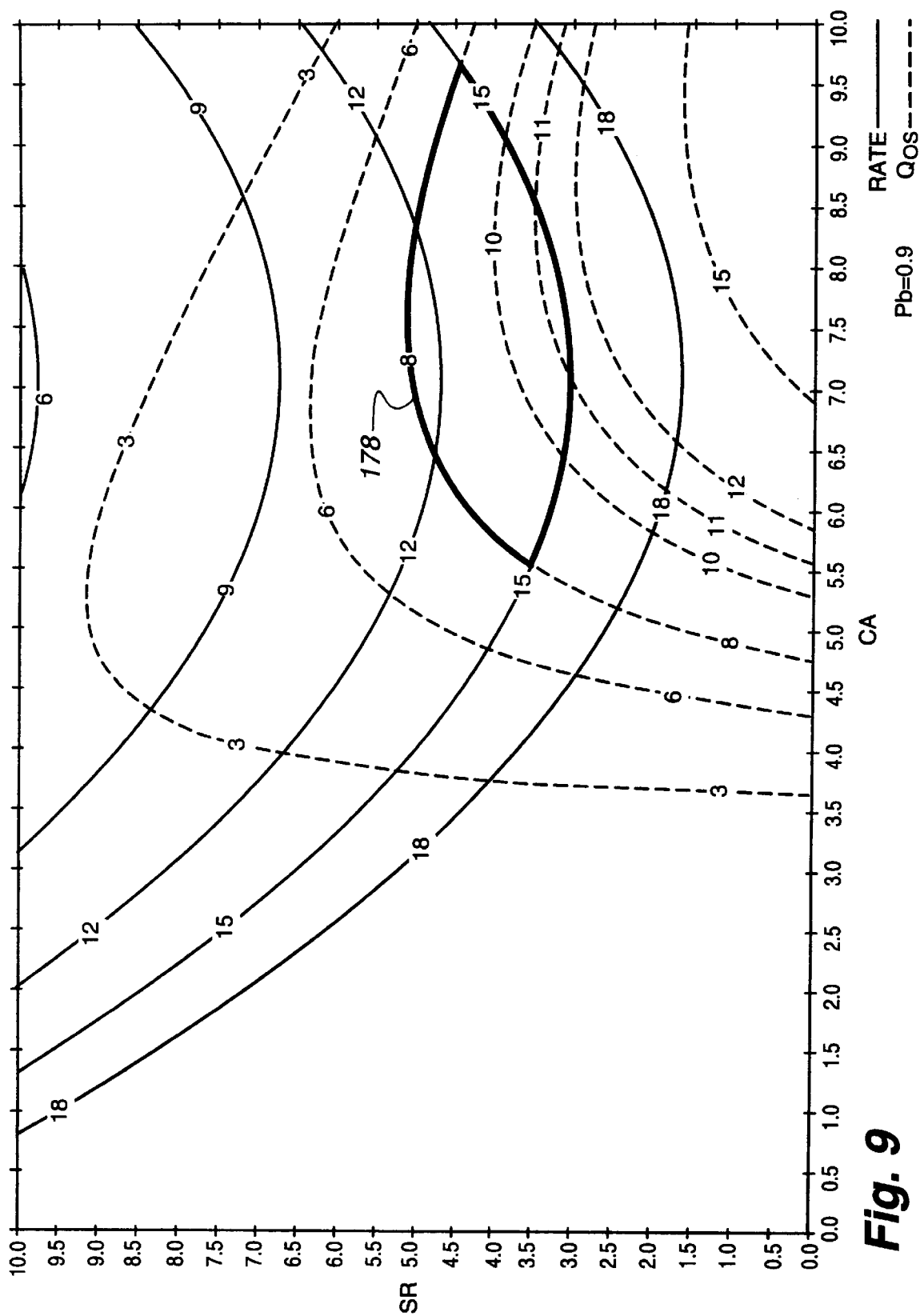
FIGS. 9–17 are contour plots showing the acceptable limits for opposite state charge and opposite state charge degradation for various ferroelectric film compositions fabricated according to the present invention.

The chemical composition for the PZT film whose charge performance is plotted in FIG. 9 is:

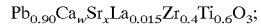
$$Pb_{0.90}Ca_wSr_xLa_{0.015}Zr_{0.4}Ti_{0.6}O_3;$$

wherein w is varied from 0 to 0.1 and x is varied from 0 to 0.1. Heavy contour line 178 sets forth the bounds for calcium and strontium of a PZT material for use in a ferroelectric capacitor having greater reliability, increased retention performance, and minimized imprint.

Figure 10:
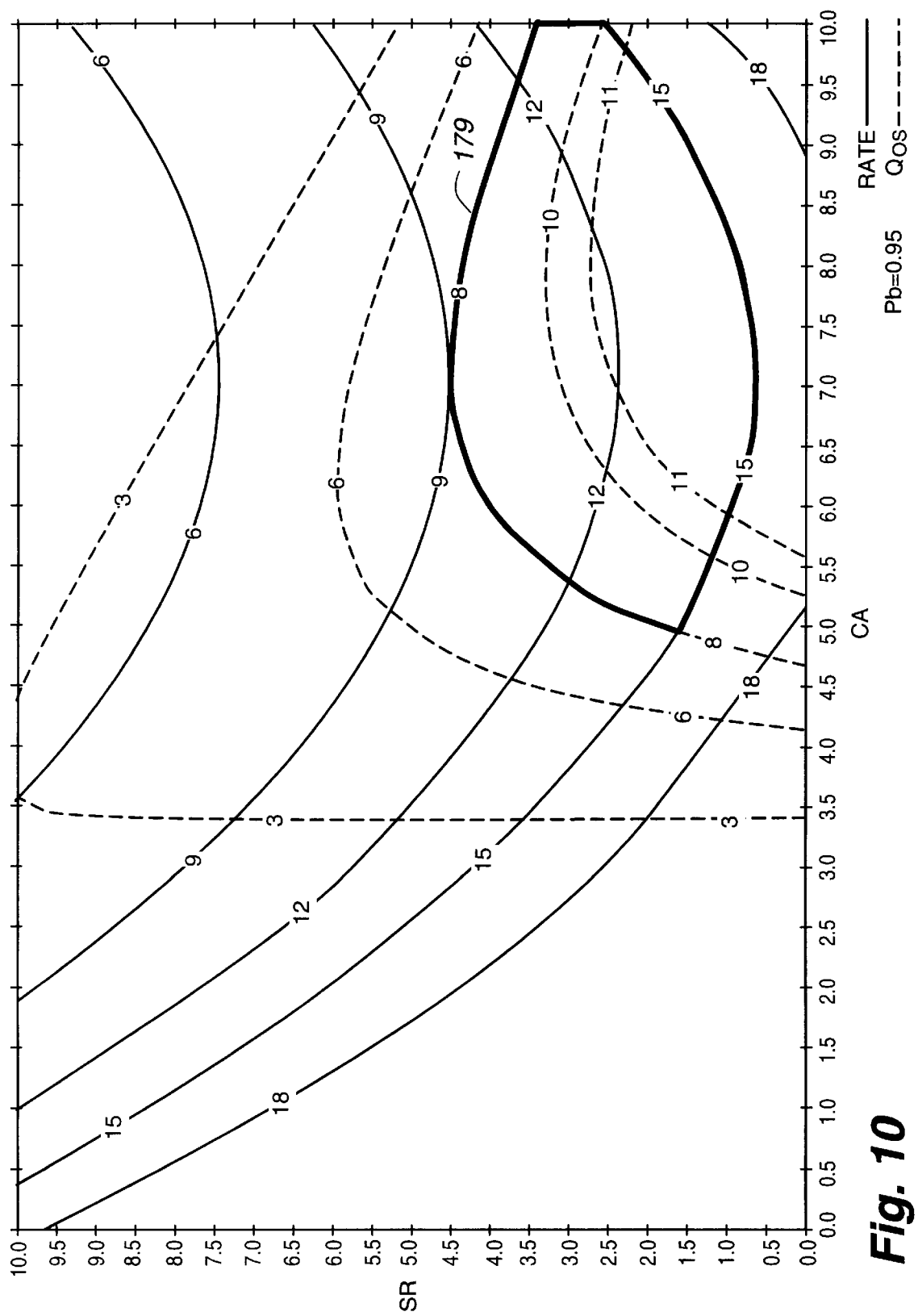

The chemical composition for the PZT film whose charge performance is plotted in FIG. 10 is:

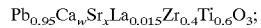
$$Pb_{0.95}Ca_wSr_xLa_{0.015}Zr_{0.4}Ti_{0.6}O_3;$$

wherein w is varied from 0 to 0.1 and x is varied from 0 to 0.1. Heavy contour line 179 sets forth the bounds for calcium and strontium of a PZT material for use in a ferroelectric capacitor having greater reliability, increased retention performance, and minimized imprint.

Figure 11:
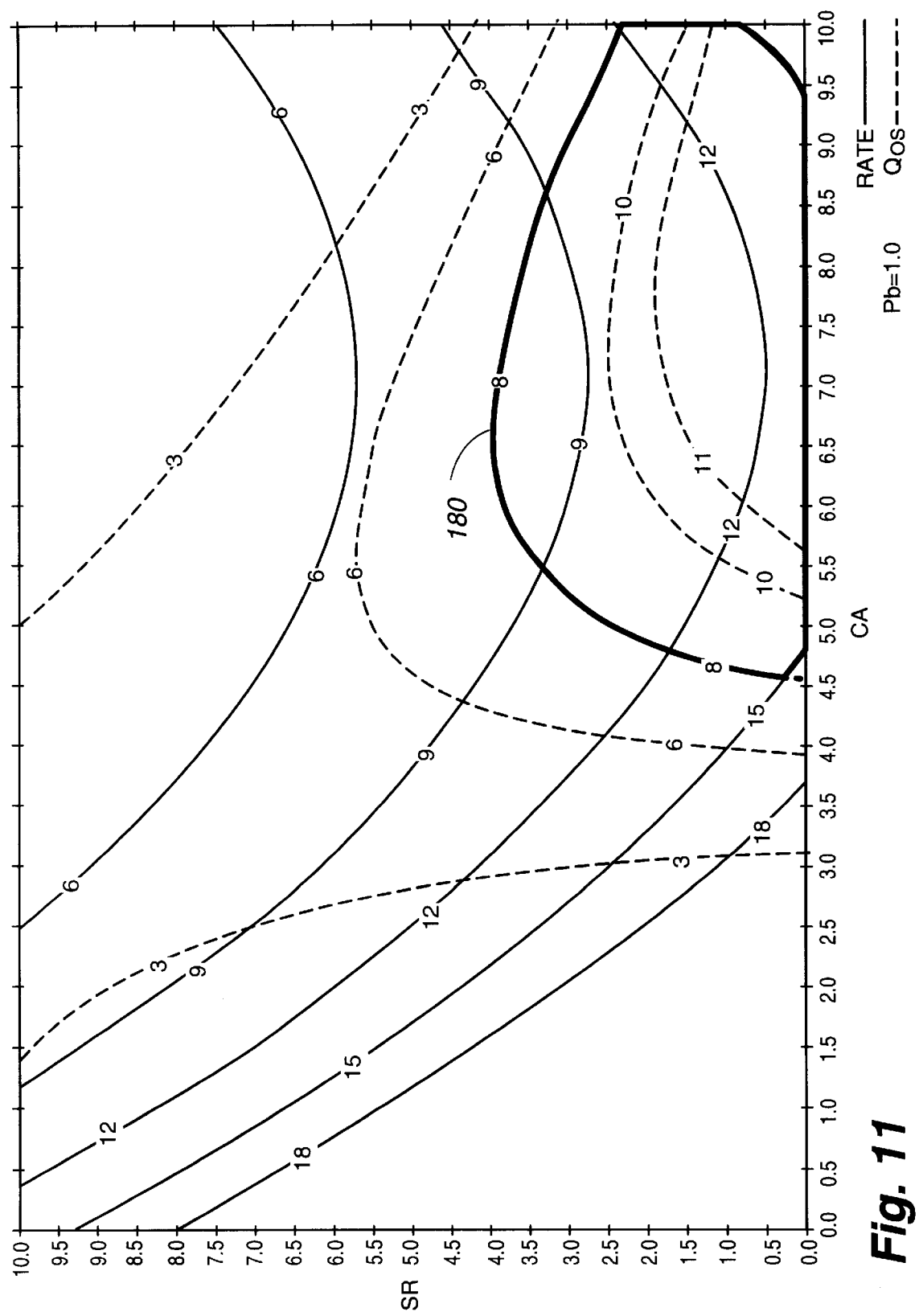

The chemical composition for the PZT film whose charge performance is plotted in FIG. 11 is:

$$PbCa_wSr_xLa_{0.015}Zr_{0.4}Ti_{0.6}O_3;$$

wherein w is varied from 0 to 0.1 and x is varied from 0 to 0.1. Heavy contour line 180 sets forth the bounds for calcium and strontium of a PZT material for use in a ferroelectric capacitor having greater reliability, increased retention performance, and minimized imprint.

Figure 12:
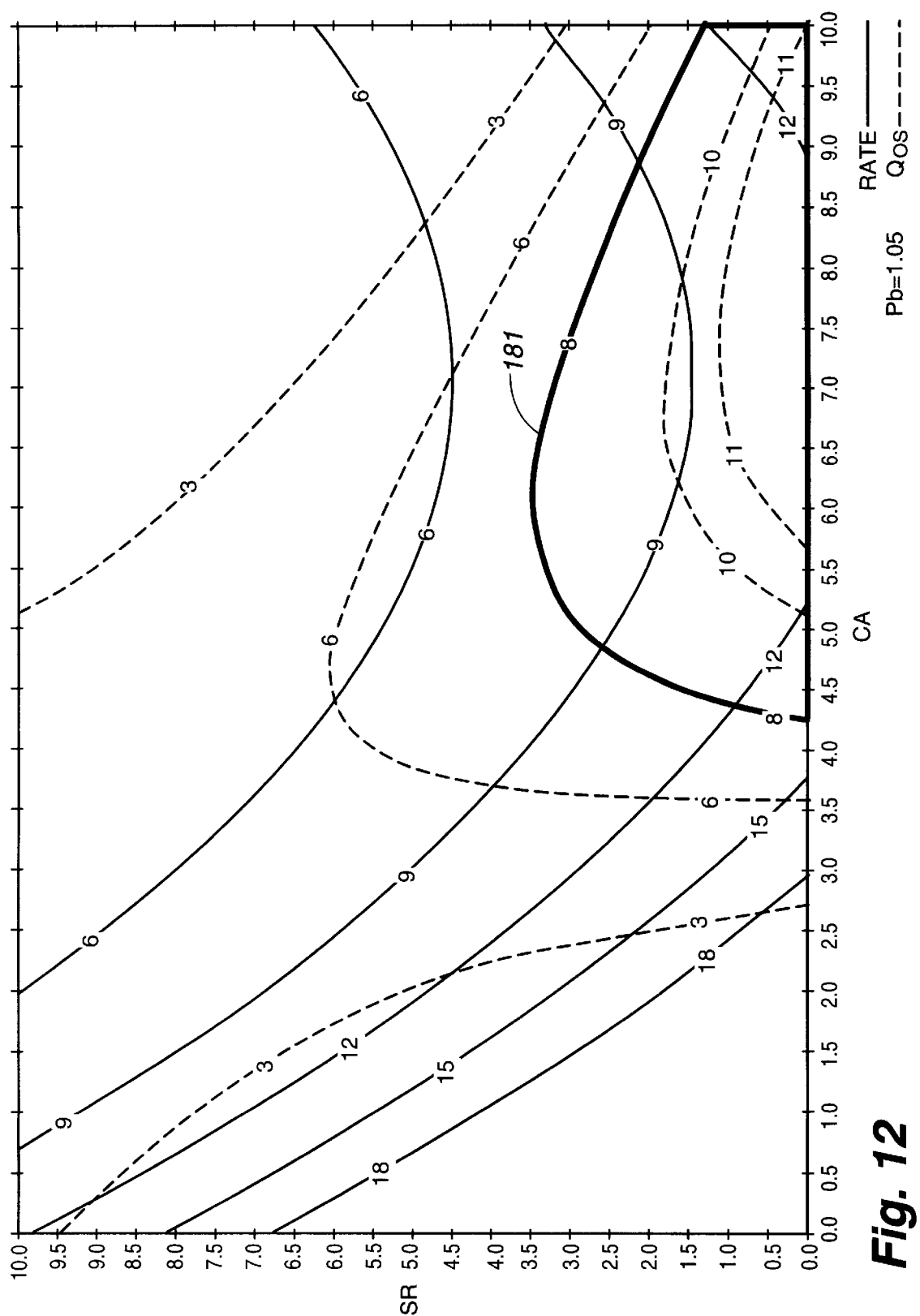

The chemical composition for the PZT film whose charge performance is plotted in FIG. 12 is:

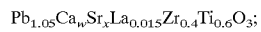
$$Pb_{1.05}Ca_wSr_xLa_{0.015}Zr_{0.4}Ti_{0.6}O_3;$$

wherein w is varied from 0 to 0.1 and x is varied from 0 to 0.1. Heavy contour line 181 sets forth the bounds for calcium and strontium of a PZT material for use in a ferroelectric capacitor having greater reliability, increased retention performance, and minimized imprint.

Figure 13:
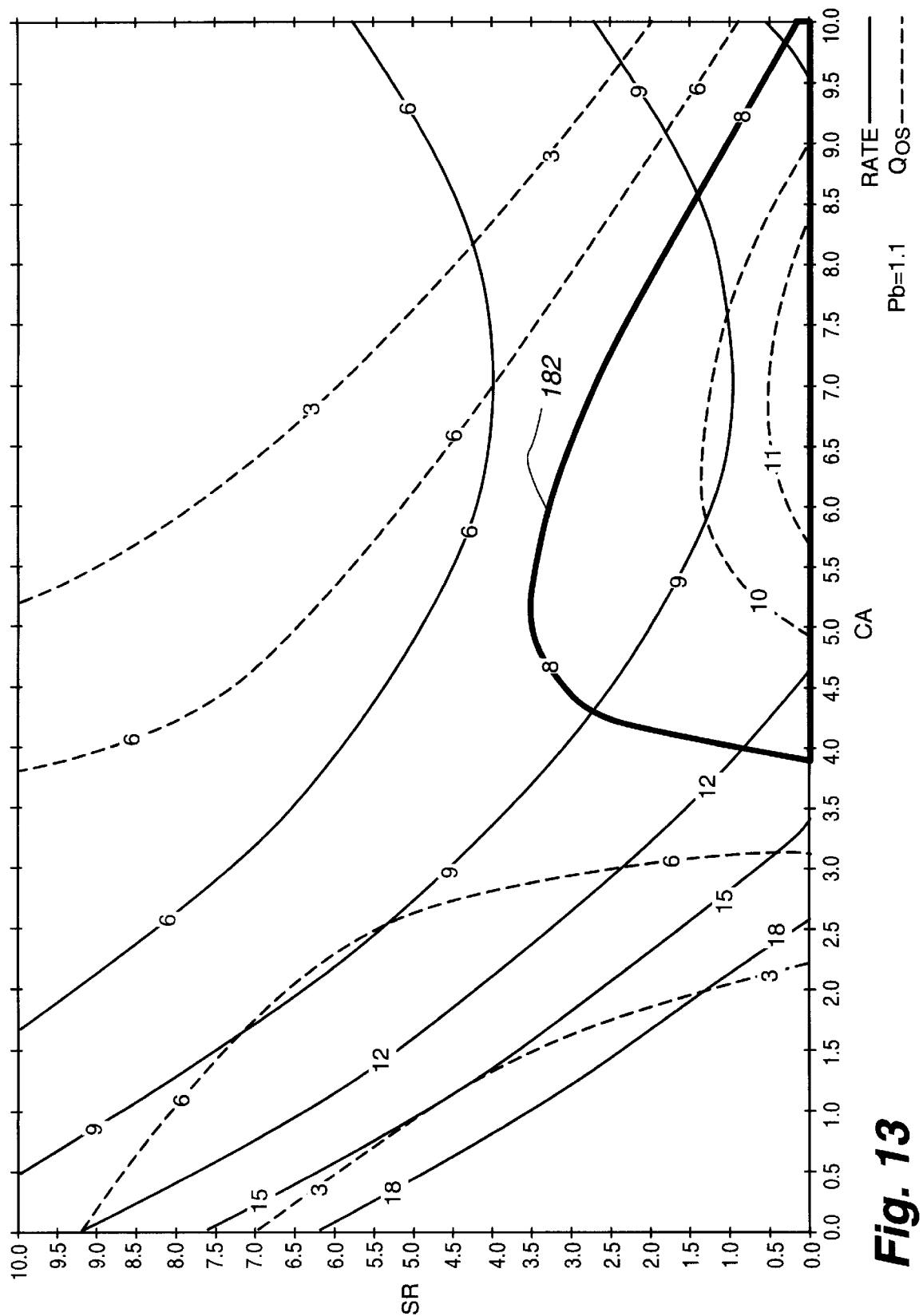

The chemical composition for the PZT film whose charge performance is plotted in FIG. 13 is:

$$Pb_{1.1}Ca_2Sr_xLa_{0.015}Zr_{0.4}Ti_{0.6}O_3;$$

wherein w is varied from 0 to 0.1 and x is varied from 0 to 0.1. Heavy contour line 182 sets forth the bounds for calcium and strontium of a PZT material for use in a ferroelectric capacitor having greater reliability, increased retention performance, and minimized imprint.

Figure 14:
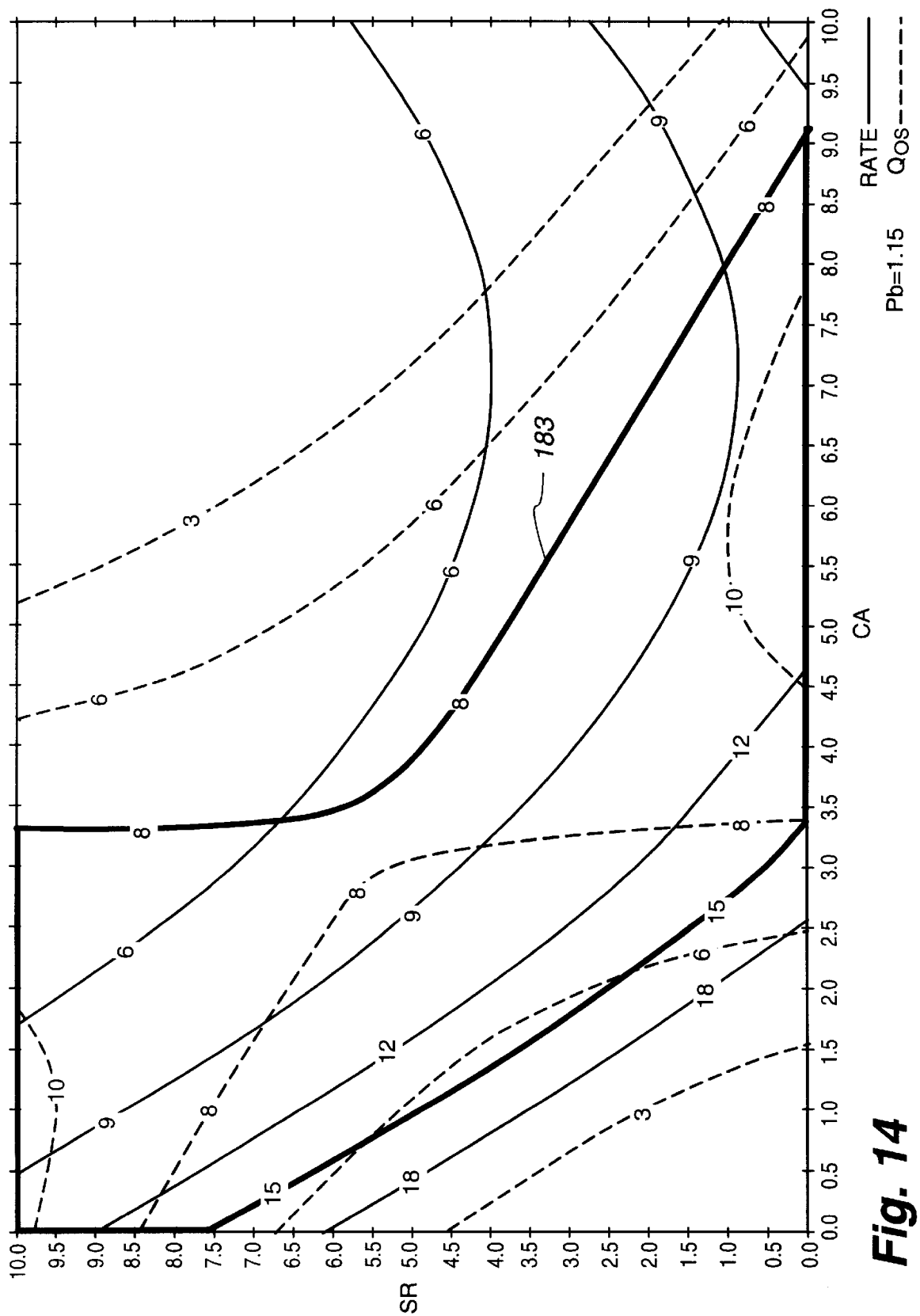

The chemical composition for the PZT film whose charge performance is plotted in FIG. 14 is:

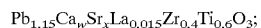
$$Pb_{1.15}Ca_wSr_xLa_{0.015}Zr_{0.4}Ti_{0.6}O_3;$$

wherein w is varied from 0 to 0.1 and x is varied from 0 to 0.1. Heavy contour line 183 sets forth the bounds for calcium and strontium of a PZT material for use in a ferroelectric capacitor having greater reliability, increased retention performance, and minimized imprint.

Figure 15:
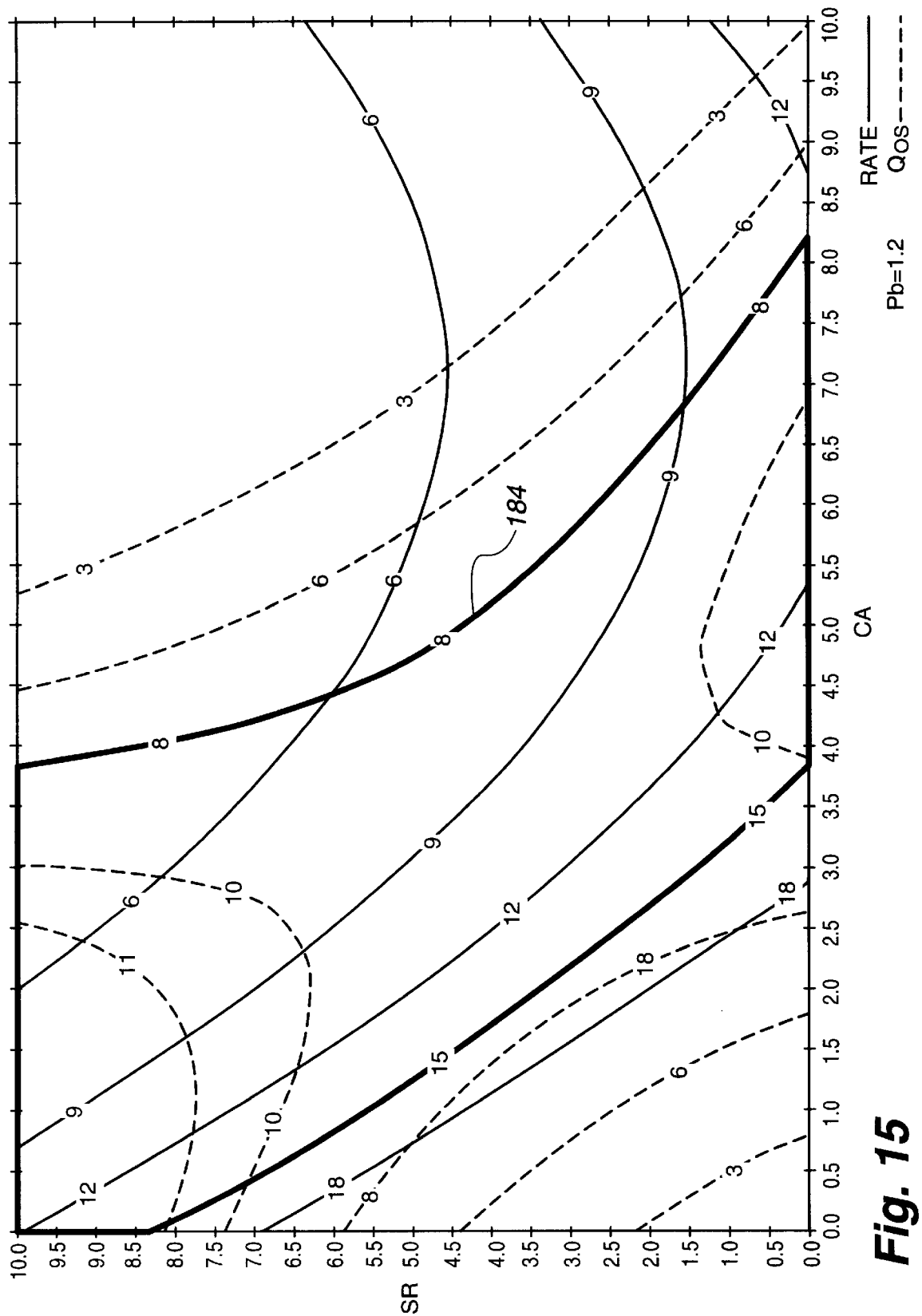

The chemical composition for the PZT film whose charge performance is plotted in FIG. 15 is:

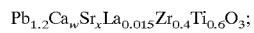
$$Pb_{1.2}Ca_wSr_xLa_{0.015}Zr_{0.4}Ti_{0.6}O_3;$$

wherein w is varied from 0 to 0.1 and x is varied from 0 to 0.1. Heavy contour line 184 sets forth the bounds for calcium and strontium of a PZT material for use in a ferroelectric capacitor having greater reliability, increased retention performance, and minimized imprint.

Figure 16:
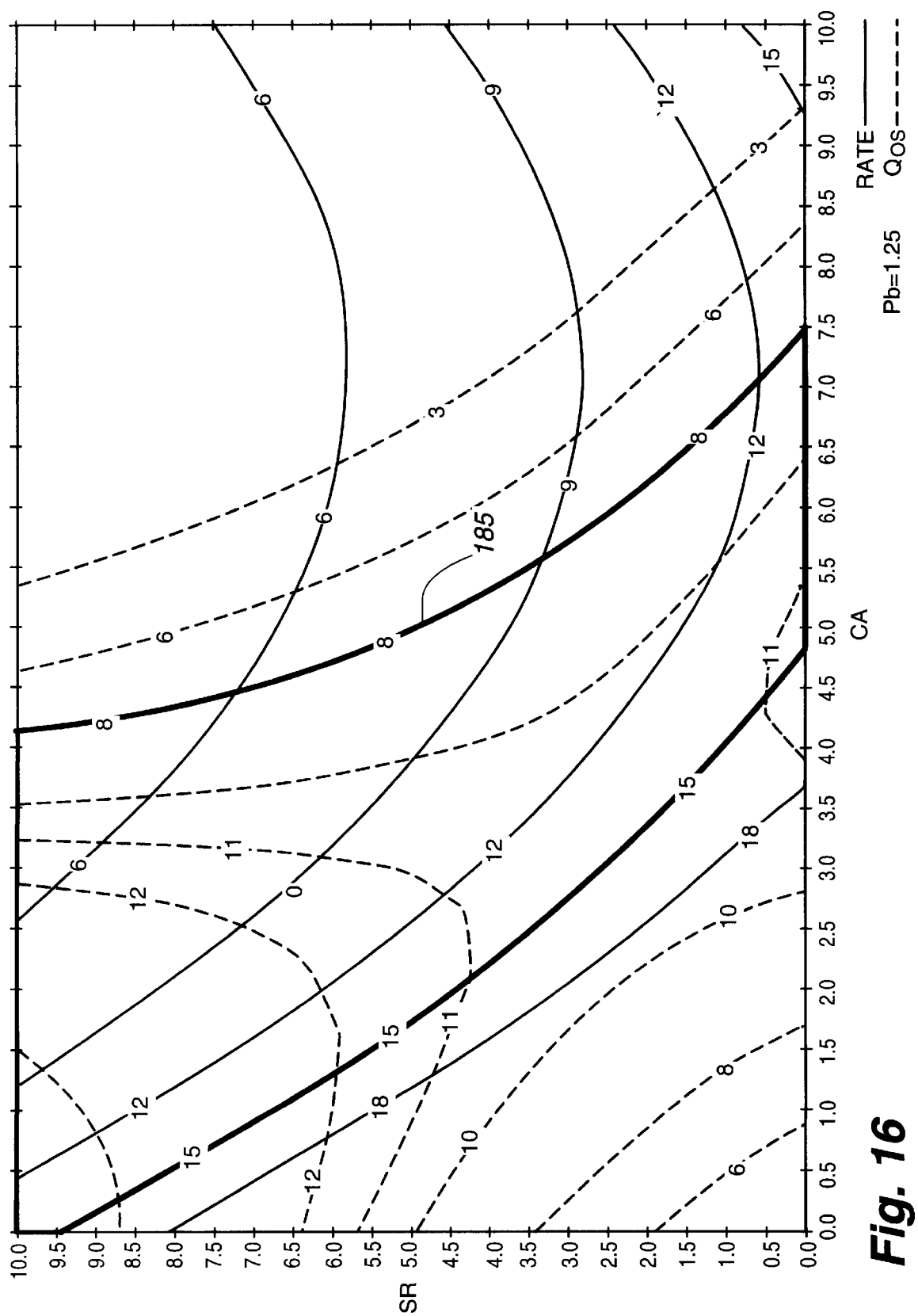

The chemical composition for the PZT film whose charge performance is plotted in FIG. 16 is:

$$Pb_{1.25}Ca_wSr_xLa_{0.015}Zr_{0.4}Ti_{0.6}O_3;$$

wherein w is varied from 0 to 0.1 and x is varied from 0 to 0.1. Heavy contour line 185 sets forth the bounds for calcium and strontium of a PZT material for use in a ferroelectric capacitor having greater reliability, increased retention performance, and minimized imprint.

Figure 17:
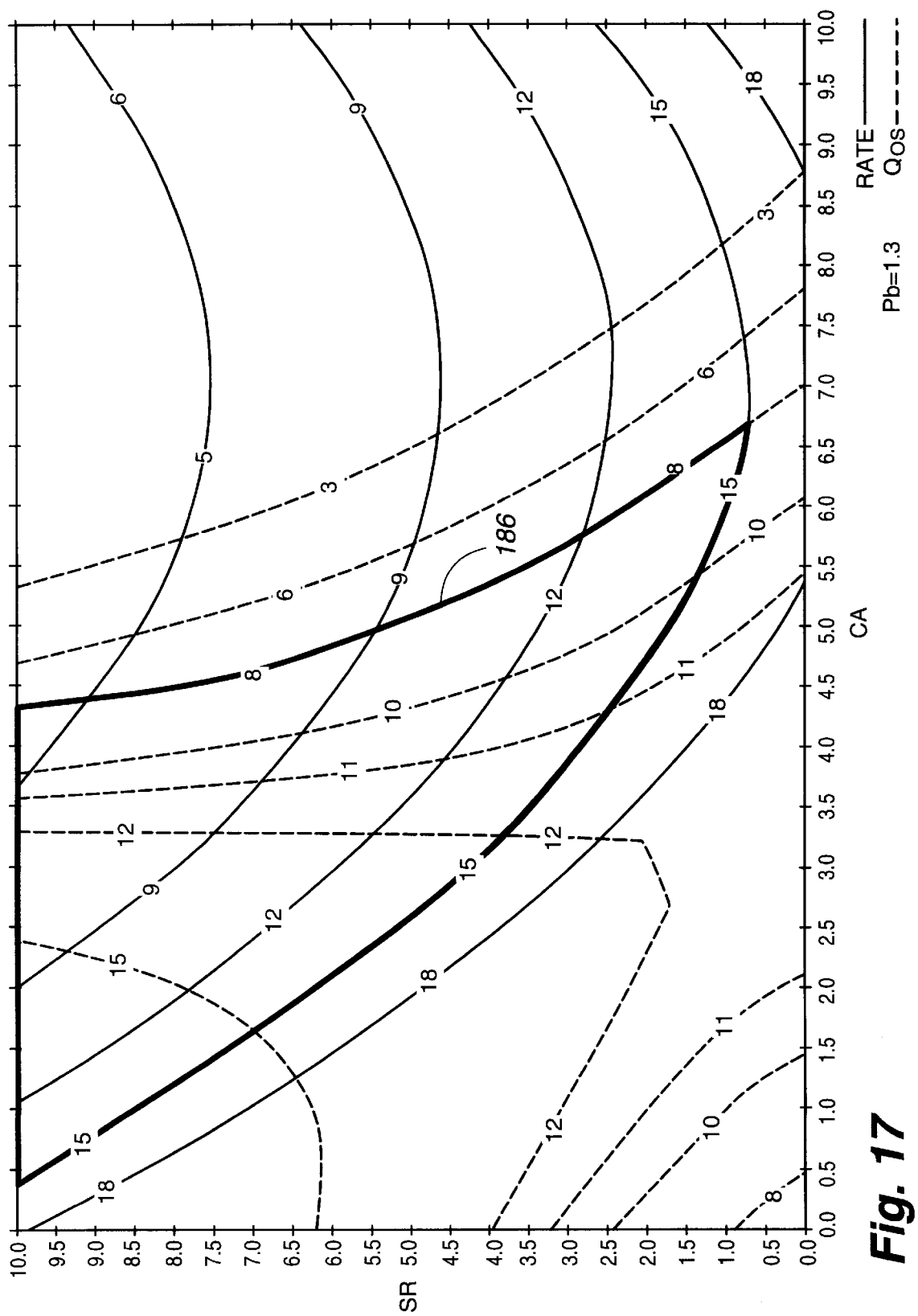

The chemical composition for the PZT film whose charge performance is plotted in FIG. 17 is:

$$Pb_{1.3}Ca_wSr_xLa_{0.015}Zr_{0.4}Ti_{0.6}O_3;$$

wherein w is varied from 0 to 0.1 and x is varied from 0 to 0.1. Heavy contour line 186 sets forth the bounds for calcium and strontium of a PZT material for use in a ferroelectric capacitor having greater reliability, increased retention performance, and minimized imprint.

Thus, the chemical formula for the high reliability, low imprint ferroelectric chemical compound described above that is further limited by the contours 176 through 186 in FIGS. 9–17 is:

$$(Pb_vCa_wSr_xLa_y)(Zr_zTi_{(1-z)})O_3;$$

wherein:
v is between 0.9 and 1.3;
w is between 0 and 0.1;
x is between 0 and 0.1;
y is between 0 and 0.1; and
z is between 0 and 0.9.

It is important to note that the oxygen subscript in the chemical formula is nominally three, but it may vary slightly in accordance with the sum of the "A" site and "B" site valences. The formulae above are deemed to include small variations from the nominal oxygen subscript.

Examples of Materials Exhibiting Increased Retention Performance

Two preferred examples of ferroelectric PZT materials exhibiting especially high retention performance tested and having measured charge performance beyond the opposite state charge criteria set forth above are:

$$Pb_{1.176}Ca_{0.048}Sr_0La_{0.016}Zr_{0.417}Ti_{0.583}O_3; \text{ and} \quad [Ex. 1]$$

$$Pb_{1.064}Ca_{0.055}Sr_0La_{0.013}Zr_{0.444}Ti_{0.556}O_3. \quad [Ex. 2]$$

Several other examples of ferroelectric PZT materials exhibiting increased retention performance tested and measured according to the criteria set forth above are:

$$Pb_{1.172}Ca_{0.041}Sr_{0.000}La_{0.018}Zr_{0.413}Ti_{0.587}O_3; \quad [Ex. 3]$$

$$Pb_{1.198}Ca_{0.042}Sr_{0.000}La_{0.016}Zr_{0.429}Ti_{0.571}O_3; \quad [Ex. 4]$$

$$Pb_{1.176}Ca_{0.048}Sr_{0.000}La_{0.016}Zr_{0.417}Ti_{0.583}O_3; \quad [Ex. 5]$$

$$Pb_{1.090}Ca_{0.048}Sr_{0.000}La_{0.013}Zr_{0.429}Ti_{0.571}O_3; \quad [Ex. 6]$$

$$Pb_{1.140}Ca_{0.052}Sr_{0.000}La_{0.018}Zr_{0.407}Ti_{0.593}O_3; \quad [Ex. 7]$$

$$Pb_{1.240}Ca_{0.053}Sr_{0.000}La_{0.016}Zr_{0.429}Ti_{0.571}O_3; \quad [Ex. 8]$$

$$Pb_{1.176}Ca_{0.048}Sr_{0.000}La_{0.016}Zr_{0.417}Ti_{0.583}O_3; \quad [Ex. 9]$$

$$Pb_{1.193}Ca_{0.038}Sr_{0.000}La_{0.014}Zr_{0.450}Ti_{0.550}O_3; \quad [Ex. 10]$$

$$Pb_{1.148}Ca_{0.051}Sr_{0.000}La_{0.017}Zr_{0.419}Ti_{0.581}O_3; \quad [Ex. 11]$$

$$Pb_{0.989}Ca_{0.057}Sr_{0.052}La_{0.013}Zr_{0.387}Ti_{0.613}O_3; \quad [Ex. 12]$$

$$Pb_{1.273}Ca_{0.015}Sr_{0.010}La_{0.023}Zr_{0.371}Ti_{0.329}O_3; \quad [Ex. 13]$$

$$Pb_{1.179}Ca_{0.053}Sr_{0.000}La_{0.018}Zr_{0.410}Ti_{0.590}O_3; \quad [Ex. 14]$$

$$Pb_{1.091}Ca_{0.020}Sr_{0.038}La_{0.016}Zr_{0.393}Ti_{0.607}O_3; \quad [Ex. 15]$$

$$Pb_{1.184}Ca_{0.051}Sr_{0.045}La_{0.017}Zr_{0.387}Ti_{0.613}O_3; \quad [Ex. 16]$$

$$Pb_{1.252}Ca_{0.061}Sr_{0.022}La_{0.018}Zr_{0.395}Ti_{0.605}O_3; \quad [Ex. 17]$$

$$Pb_{1.060}Ca_{0.042}Sr_{0.042}La_{0.013}Zr_{0.424}Ti_{0.576}O_3; \quad [Ex. 18]$$

$$Pb_{1.150}Ca_{0.046}Sr_{0.045}La_{0.018}Zr_{0.386}Ti_{0.614}O_3; \quad [Ex. 19]$$

$$Pb_{1.273}Ca_{0.015}Sr_{0.010}La_{0.023}Zr_{0.371}Ti_{0.629}O_3; \quad [Ex. 20]$$

$$Pb_{1.084}Ca_{0.048}Sr_{0.037}La_{0.016}Zr_{0.399}Ti_{0.601}O_3; \quad [Ex. 21]$$

$$Pb_{0.949}Ca_{0.076}Sr_{0.042}La_{0.012}Zr_{0.402}Ti_{0.598}O_3; \quad [Ex. 22]$$

$$Pb_{1.137}Ca_{0.050}Sr_{0.000}La_{0.014}Zr_{0.438}Ti_{0.562}O_3; \quad [Ex. 23]$$

$$Pb_{1.095}Ca_{0.041}Sr_{0.044}La_{0.013}Zr_{0.420}Ti_{0.580}O_3; \quad [Ex. 24]$$

$$Pb_{1.256}Ca_{0.015}Sr_{0.010}La_{0.025}Zr_{0.381}Ti_{0.619}O_3; \quad [Ex. 25]$$

$$Pb_{1.099}Ca_{0.043}Sr_{0.072}La_{0.012}Zr_{0.403}Ti_{0.597}O_3; \quad [Ex. 26]$$

Examples of Materials Not Exhibiting Increased Retention Performance

Several examples of ferroelectric PZT materials having the same general chemical formula, but not exhibiting increased retention performance tested and measured according to the criteria set forth above are:

$$Pb_{0.95}Ca_{0.025}Sr_{0.070}La_{0.015}Zr_{0.4}Ti_{0.6}O_3; \quad [Ex. 27]$$

$$Pb_{1.05}Ca_{0.025}Sr_{0.060}La_{0.015}Zr_{0.4}Ti_{0.6}O_3; \quad [Ex. 28]$$

$$Pb_{1.10}Ca_{0.005}Sr_{0.035}La_{0.015}Zr_{0.4}Ti_{0.6}O_3; \quad [Ex. 29]$$

$$Pb_{1.15}Ca_{0.015}Sr_{0.025}La_{0.015}Zr_{0.4}Ti_{0.6}O_3; \quad [Ex. 30]$$

Enhanced Testing for Packaged Ferroelectric Memories

An enhanced package-level test was conducted on ferroelectric capacitors with a ferroelectric film having the following chemical formula:

$$Pb_{1.17}Ca_{0.052}Sr_{0.024}La_{0.034}Zr_{0.42}Ti_{0.58}O_3; \quad [Ex. 31]$$

The enhanced package-level retention test is further corroboration of the retention criteria set forth above for the opposite state charge conducted on ferroelectric capacitors.

Figure 18:
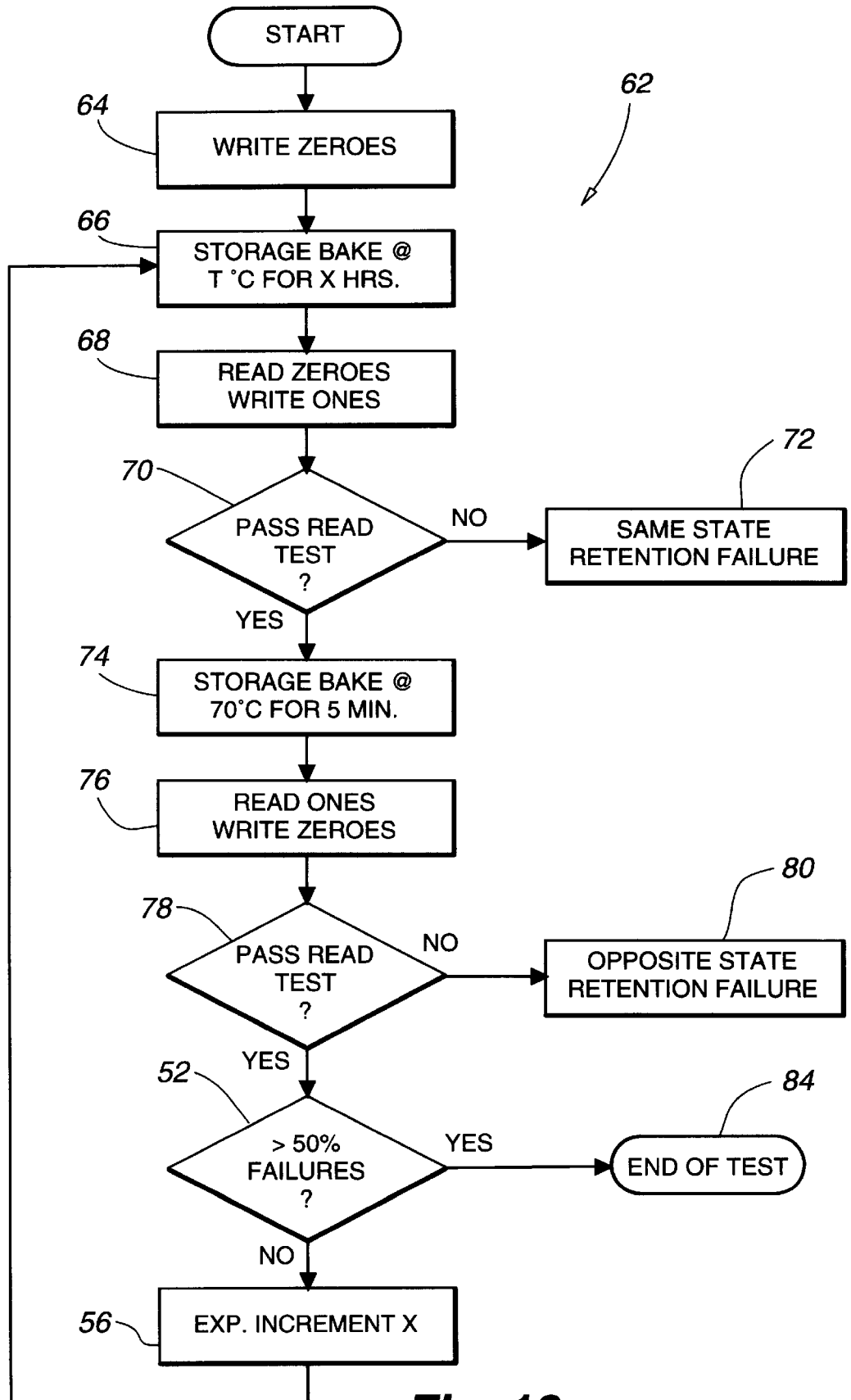
FIG. 18 is a block diagram of a testing flow for measuring retention performance of a ferroelectric memory.

Referring now to FIG. 18, a retention test method 62 is shown in block diagram form that provides a metric for the retention performance of a ferroelectric memory, including both "same state" and "opposite state" testing functions. This test method can be used to evaluate the retention performance of various ferroelectric memories built with different ferroelectric dielectric materials. Typically a sample population of ferroelectric memories is repeatedly "storage baked" (without power) at temperature until a cumulative failure of more than 50% of the sample population is attained. A "failure" is defined for the purposes of test method 62 as the inability of a memory device under test ("DUT") to retain data in any address.

At an initial step 64, all logic zeroes are written into each DUT of the sample population of ferroelectric memories. Power is then removed from each of the DUTs, and the sample population is storage baked at a temperature of T °

C. for X hours. The temperature variable T varies between room temperature and 250° C. Test method 62 ideally performed at specified temperature intervals within this temperature range. The time variable X is initially chosen such that after the test method 62 is performed once, there is a resultant percentage failure that is much less than 50% of the sample population. For example, if baking step 66 of the test is performed at 100 degrees Centigrade, an initial time variable X is typically 168 hours. At step 68 power is returned to the DUTs and the previously written pattern of all logic zeroes is read, and a new pattern of all logic ones is written to the DUTs. At decision point 70, the data output of the DUTs are compared to the correct output (in this case, all data zeroes). If there is a failure in a DUT, a "same state retention failure" is recorded at step 72, and the DUT is removed from any subsequent testing steps. If the data output of the DUT is correct, the test is continued at step 74 with a 70 degree Centigrade storage bake for five minutes.

At step 76 power is returned to the DUTs and the pattern of all logic ones is read and a new pattern of all logic zeroes is written to the DUTs. At decision point 78, the data output of the DUTs are compared to the correct output (in this case, all data ones). If there is a failure in a DUT, an "opposite state retention failure" (failure due to the imprint failure mechanism) is recorded at step 80, and the DUT is removed from any subsequent testing steps. If the data output of the DUT is correct, the test is continued. At decision point 82, the cumulative number of same state and opposite state retention failures is tabulated. If the number of failures is greater than or equal to a cumulative 50% of the number of ferroelectric memories in the original sample population, the test method 62 is terminated. The actual storage bake time X to 50% failure is extracted from the fit of a log normal cumulative failures versus log cumulative storage bake time X graph. If the total number of errors is less than 50%, however, the test is continued. At step 86, the time variable X is geometrically increased and the test method 62 continued at step 66. The nature of the exact time intervals used in test method 62 is related to the performance characteristics of the ferroelectric memories being tested. A small initial increment will ensure that retention performance is precisely measured, but may result in an unacceptably long testing time. A large initial increment may result in a failure of over 50% being recorded with only one pass through the test. These considerations continue to apply to all of the subsequent incremental values of X as well.

Figure 19:
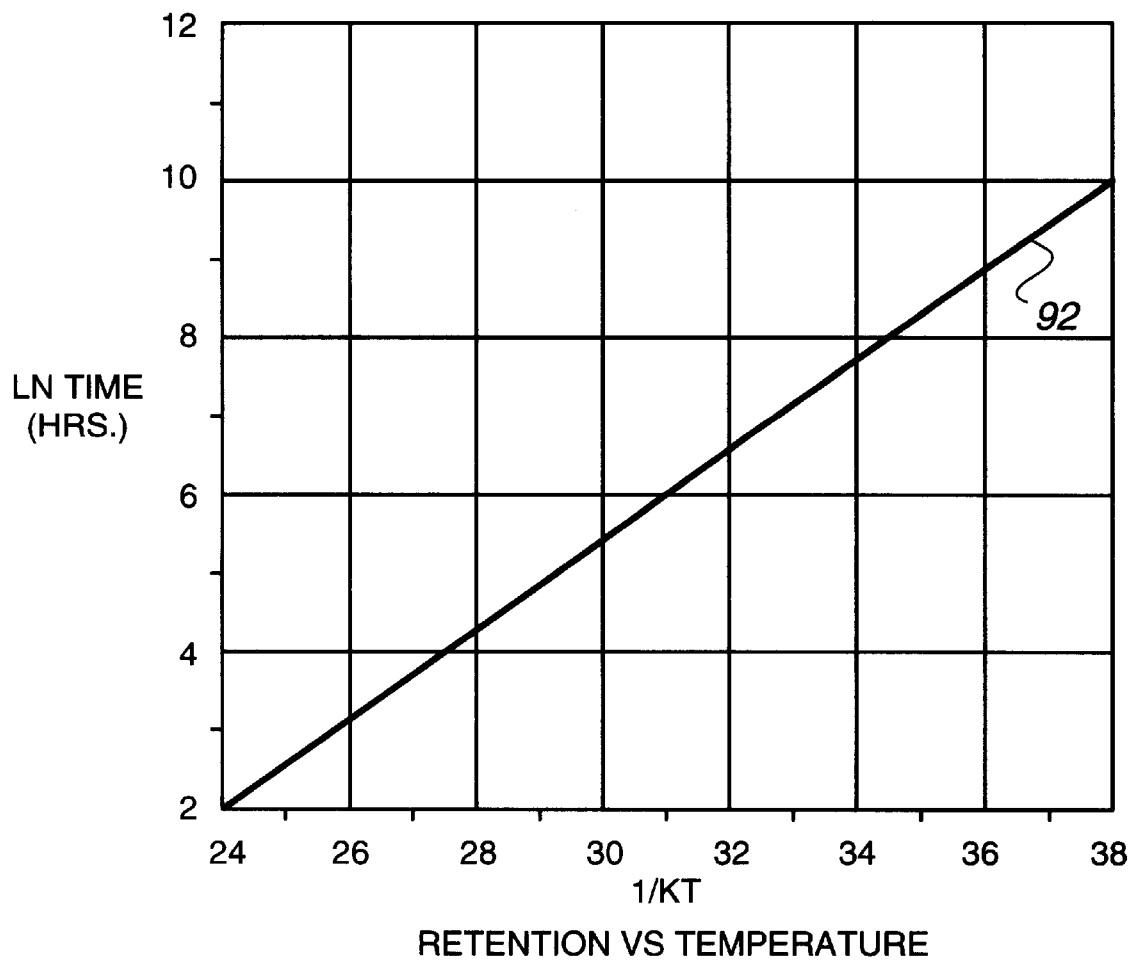
FIG. 19 is a graph of retention performance of a ferroelectric memory in which the ferroelectric material is doped with lanthanum.

The result of the test method 62 being conducted at various temperatures within a predetermined temperature range is shown in FIG. 19 for a PLZT based ferroelectric memory. (PLZT is lanthanum doped PZT, in this case doped with 3% lanthanum.) Recall that each time the test method 62 is completed at a specific temperature, the time to 50% failure is determined. In the graph shown in FIG. 16, the natural log of this time is plotted at the inverse of each temperature at which the test was conducted. The slope and the intercept of resultant straight line 92 is a metric of the opposite state or imprint retention performance of the ferroelectric material used in the DUT, and, in FIG. 16 provides a base line for retention performance. The linear relationship between log time and inverse temperature is well known and called Arrhenius behavior.

Figure 20:
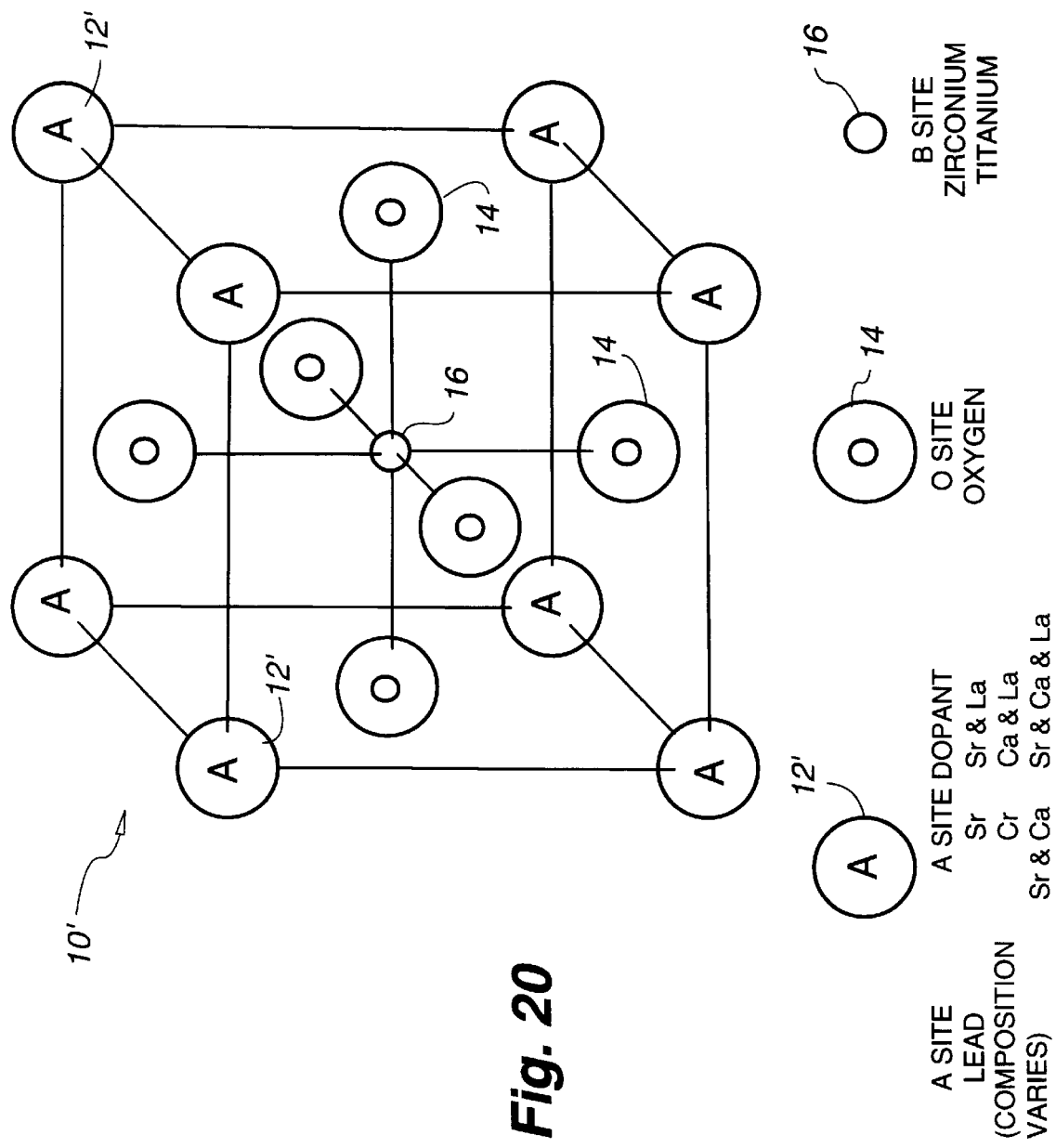
FIG. 20 is a diagram of the perovskite crystal structure for a unit cell that is associated with PZT and other ferroelectric materials, showing the A site dopants according to the present invention: strontium and/or calcium and lanthanum, if desired.

A PZT ferroelectric film based upon the unit cell 10' shown in FIG. 20 has increased retention opposite state performance when doped with either strontium, calcium, or the combination of strontium and calcium as specified by contours 178–186 in FIGS. 9–17. Also, as shown in these drawing figures, the amount of lead in the film also affects retention. The ferroelectric film can also be doped with lanthanum, but as previously stated, it is not believed that lanthanum materially affects retention performance.

Figure 5:
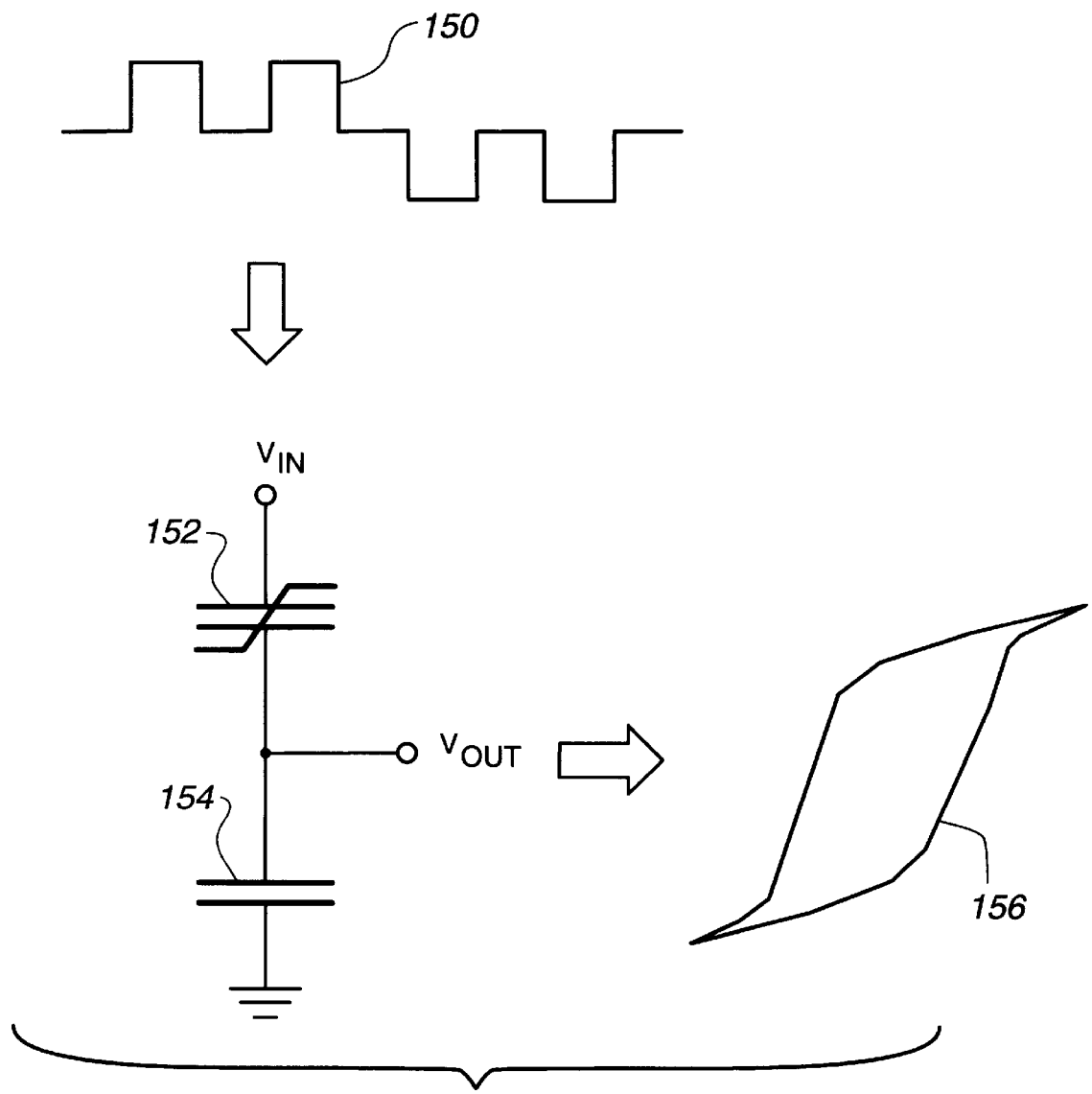
FIG. 5 is a schematic diagram of a Sawyer tower circuit for receiving an input pulse waveform and for generating the hysteresis curve associated with a ferroelectric capacitor.
Figure 6A:
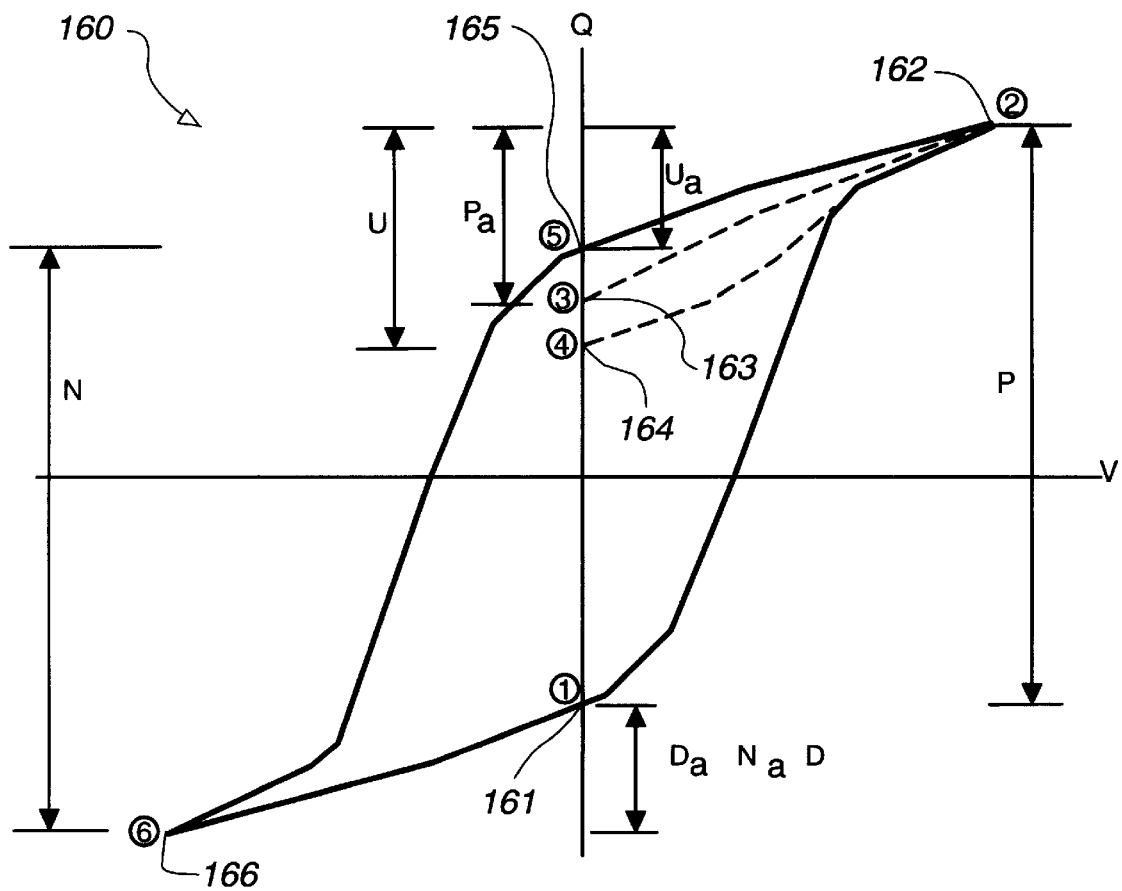
FIG. 6A is a hysteresis curve for a ferroelectric capacitor showing the various capacitor charge components in detail.
Figure 6B:
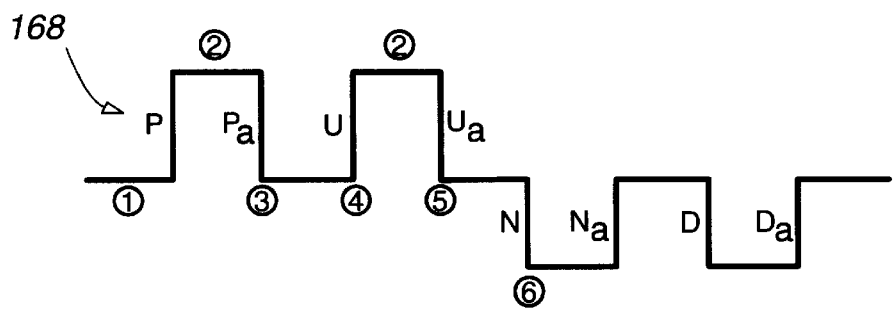
FIG. 6B is a timing diagram of the input pulse waveform corresponding to the hysteresis curve of FIG. 6A.
Figure 21:
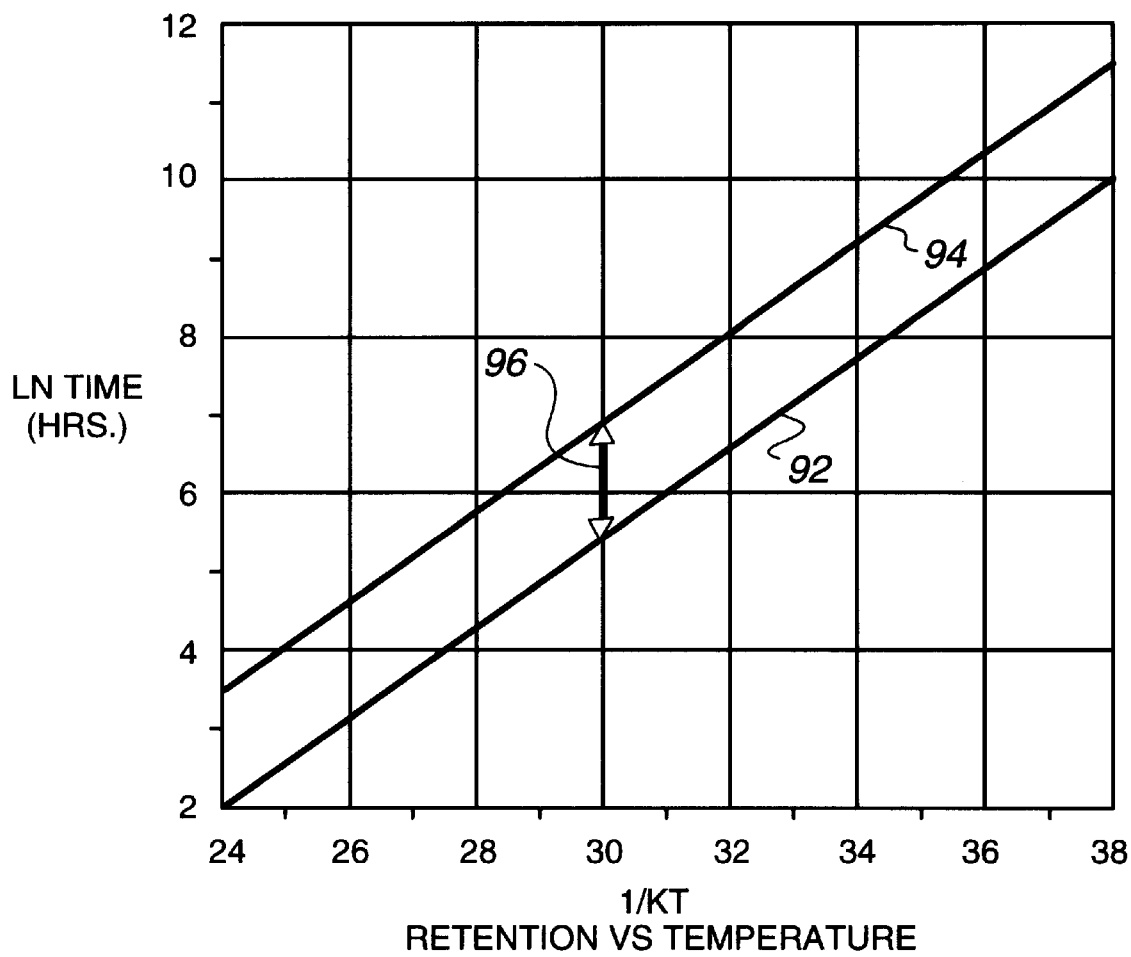
FIG. 21 is a graph of improved retention performance of a ferroelectric memory in which the ferroelectric material is doped with calcium and/or strontium according to the present invention.

Referring now to FIG. 21, an opposite state retention performance graph is shown for a preferred PZT ferroelectric material, using the test method shown in FIG. 5. The original retention performance for a lanthanum doped PZT material is shown as straight line 92. The 50% metric for retention as a function of temperature for the preferred composition is shown as straight line 94. The difference 96 in retention performance is approximately five times that of the lanthanum only doped PZT material. That is, the 50% cumulative percentage failure is achieved at a time five times as long as the time required for a 50% cumulative percentage failure for the lanthanum only doped material.

Figure 22:
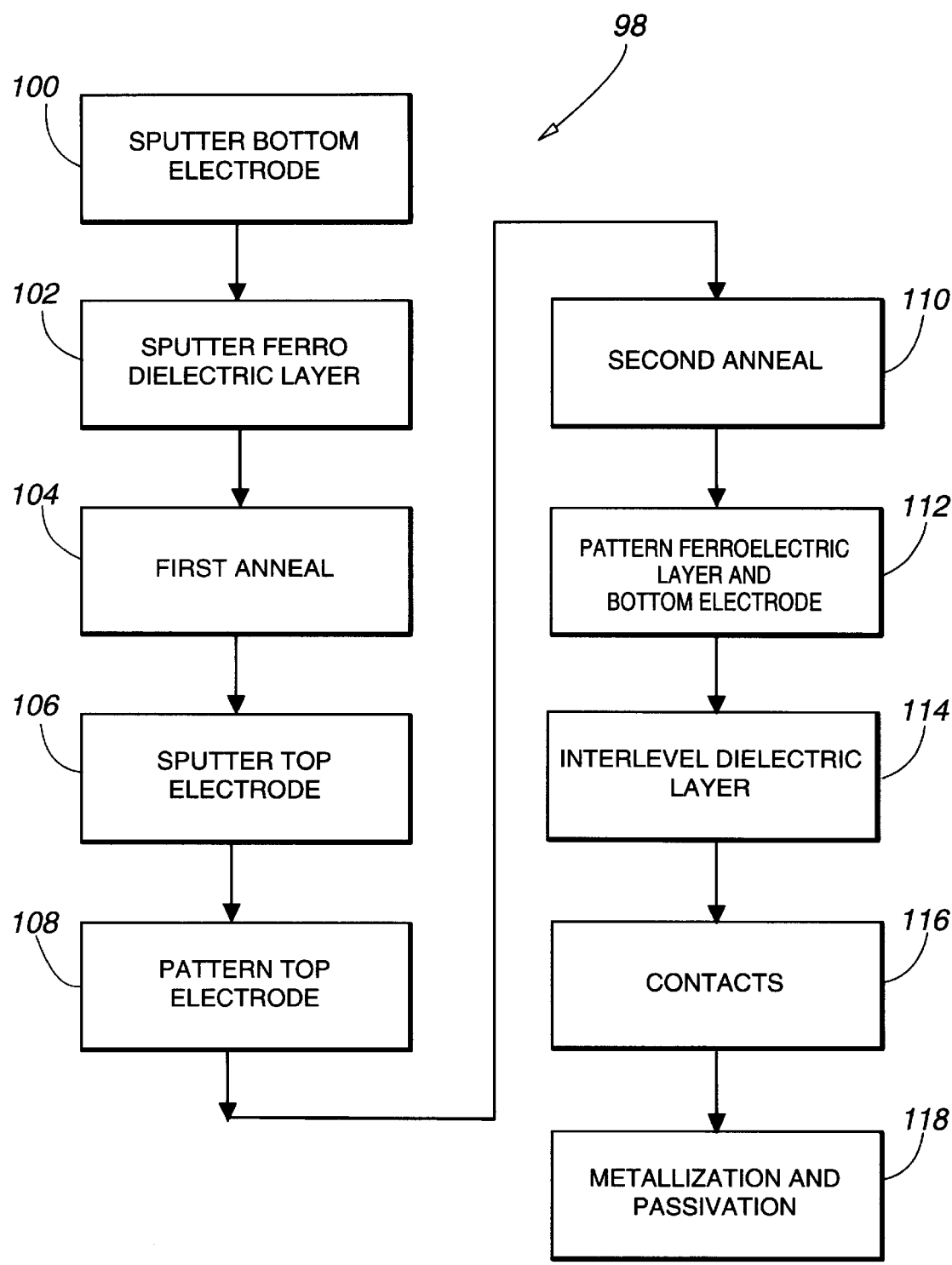
FIG. 22 is a block diagram of a process flow according to the present invention.

Referring now to FIG. 22, a method 98 is shown for fabricating an integrated circuit memory with the PZT ferroelectric material doped according to the present invention. While this fabrication method includes the use of platinum electrodes, it is well known to those skilled in the art that other electrode materials such as other noble metals and conductive oxides may be used. The method begins with the step 100 of sputtering a platinum bottom electrode onto a substrate containing the necessary transistor circuitry to make a complete memory. At step 102, a ferroelectric dielectric layer is sputtered onto the bottom electrode or substrate from a target formed of PZT doped with calcium, strontium, and lanthanum, or subcombinations thereof according to the present invention. When ordering any target according to the PZT chemical formulae set forth above, a purity of about 0.999 or greater should ideally be specified.

Figure 23:
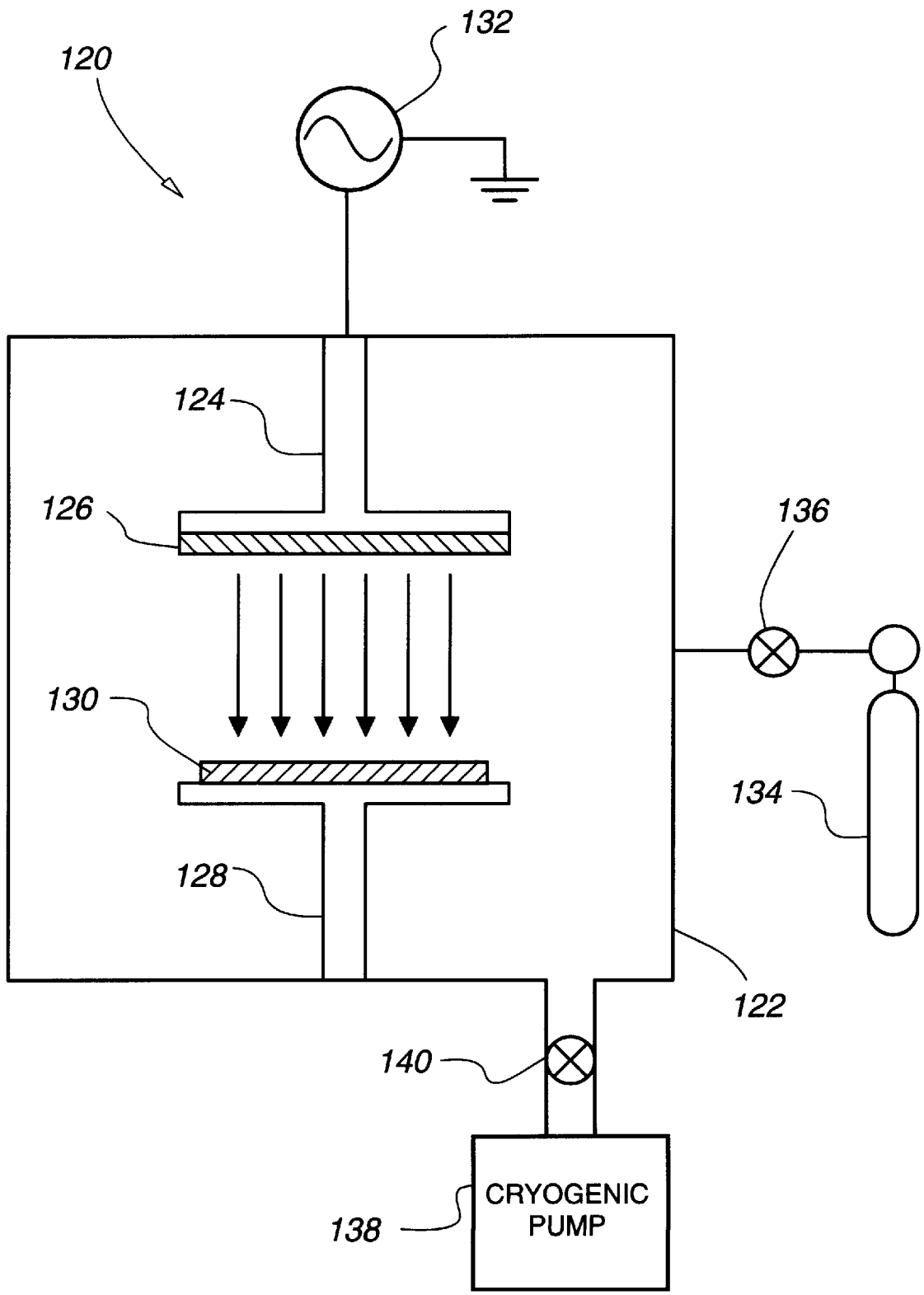
FIG. 23 is diagram of a sputtering chamber for use in the process flow of FIG. 22.

Turning to FIG. 23, a sputtering system 120 is shown, which is suitable for carrying out step 102. Sputtering system 120 includes a sputtering chamber 122, a base 124 for mounting a sputtering target 126. The sputtering target is PZT doped with calcium and strontium, or calcium, strontium, and lanthanum according to the present invention. A base 128 provides support for a wafer 130 on which a ferroelectric dielectric layer is desired. A source of RF energy 132 is provided to the target 126. A source of inert gas 134 is introduced into the sputtering chamber 122 through valve 136. Finally, a cryogenic pump 138 is used to create a vacuum within sputtering chamber 122, the level of the vacuum being controlled through valve 140.

Sputtering step 102 is performed for a duration of between two minutes and two hours to form a desired film thickness between 750 Angstroms and 5000 Angstroms. The sputtering step is ideally performed for a duration of about ten minutes to achieve the desired film thickness. Ideally, sputtering step 102 is performed in an Argon atmosphere at a pressure between 1 and 20 mtorr. Any inert gas, or the combination of an inert gas and oxygen, however, can be used. The target 126 is energized by an RF power of between 100 and 2000 watts, at an RF frequency of about 13.56 MHz. The temperature of the target is maintained at about 100° C.

It is important to avoid any contamination due to moisture or hydrocarbons during sputtering step 102.

Returning now to FIG. 19, the fabrication method continues at step 104, wherein a first anneal of the film is conducted at a temperature above 550° C. This anneal can either be done with a rapid thermal annealer for a short time such as ten seconds. Alternatively, the anneal can be performed in a conventional furnace for one hour.

At step 106, a top platinum electrode is sputtered on to the ferroelectric layer. At step 108, the top electrode is patterned, which includes separate photolithography and etching steps. The etching of the top platinum electrode can be accomplished through either ion milling or a reactive ion etch.

At step 110, a second anneal is performed, which can be the same as the anneal described in step 104. At step 112, the ferroelectric dielectric layer and bottom electrodes are patterned. The dielectric layer and bottom electrodes are ideally patterned separately, each with a photolithography and etching step. The etching step is the same as described with respect to step 108. Once the top and bottom electrodes and the ferroelectric dielectric layer have been patterned, a silicon dioxide interlevel dielectric layer is formed at step 114 over the entire surface of the integrated memory. At step 116, contacts are formed in the interlevel dielectric layer above those portions of the memory cell that are to be subsequently interconnected. At step 118, a standard aluminum metalization layer is deposited and patterned, and a silicon dioxide passivation layer is finally formed.

Having described and illustrated the principles of the invention in a preferred embodiment thereof, it is appreciated by those having skill in the art that the invention can be modified in arrangement and detail without departing from such principles. We therefore claim all modifications and variation coming within the spirit and scope of the following claims.

We claim:

1. A ferroelectric film for use in a ferroelectric capacitor having increased retention performance comprising lead zirconate titanate doped with at least one dopant selected from the group consisting of calcium and strontium, and having a lead composition selected so that a corresponding measured opposite state charge of the ferroelectric capacitor is greater than eight micro-Coulombs per square centimeter, and the rate of imprint degradation is less than fifteen percent per decade.

2. A ferroelectric film as in claim 1 doped with lanthanum.

3. A ferroelectric film as in claim 1 having a chemical formula:

$$(Pb_vCa_wSr_xLa_y)(Zr_zTi_{(1-z)})O_3;$$

wherein:

v is between 0.9 and 1.3;

w is between 0 and 0.1;

x is between 0 and 0.1;

y is between 0 and 0.1; and z is between 0 and 0.9.

4. A ferroelectric film as in claim 1 having a chemical formula:

$$(Pb_vCa_wSr_xLa_y)(Zr_zTi_{(1-z)})O_3;$$

wherein:

v is about 1.176;

w is about 0.048;

x is about 0;

y is about 0.016; and z is about 0.0417.

5. A ferroelectric film as in claim 4 having the chemical formula:

$$(Pb_vCa_wSr_xLa_y)(Zr_zTi_{(1-z)})O_3;$$

wherein:

v is about 1.064;

w is about 0.055;

x is about 0;

y is about 0.03; and z is about 0.4.

6. A ferroelectric film as in claim 1 having a thickness between 750 Angstroms and 5000 Angstroms.

7. A ferroelectric capacitor as in claim 1 further comprising:

a noble metal bottom electrode; and a noble metal top electrode.

8. A ferroelectric capacitor as in claim 7 in which the top and bottom electrodes comprise platinum.

9. A ferroelectric capacitor as in claim 7 further comprising a transistor coupled to the ferroelectric capacitor to form a ferroelectric memory cell.

* * * * *